(12) United States Patent
Binder et al.

(10) Patent No.: US 12,189,000 B2
(45) Date of Patent: Jan. 7, 2025

(54) DUAL CHANNEL MAGNETIC FIELD SENSOR

(71) Applicant: Infineon Technologies AG, Neubiberg (DE)

(72) Inventors: Gernot Binder, Klagenfurt (AT); Christoph Krall, Klagenfurt (AT)

(73) Assignee: Infineon Technologies AG, Neubiberg (DE)

( * ) Notice: Subject to any disclaimer, the term of this patent is extended or adjusted under 35 U.S.C. 154(b) by 165 days.

(21) Appl. No.: 18/158,826

(22) Filed: Jan. 24, 2023

(65) Prior Publication Data

US 2024/0248155 A1  Jul. 25, 2024

(51) Int. Cl.
*G01R 33/06* (2006.01)
*G01D 5/14* (2006.01)
*G01R 15/20* (2006.01)
*G01R 33/07* (2006.01)
*G01R 33/09* (2006.01)

(52) U.S. Cl.
CPC .............. *G01R 33/06* (2013.01); *G01D 5/14* (2013.01); *G01R 15/20* (2013.01); *G01R 33/077* (2013.01); *G01R 33/09* (2013.01)

(58) Field of Classification Search
USPC ......................... 324/207.2, 207.21, 246, 272
See application file for complete search history.

(56) References Cited

U.S. PATENT DOCUMENTS

| 10,761,153 | B2 * | 9/2020 | Hainz | H01F 7/0273 |
| 2004/0189294 | A1 * | 9/2004 | Ishihara | G01R 33/09 324/252 |

FOREIGN PATENT DOCUMENTS

CA          3037535 A1 *  9/2019  ............... G01R 1/18

\* cited by examiner

*Primary Examiner* — Vincent Q Nguyen
(74) *Attorney, Agent, or Firm* — Harrity & Harrity, LLP

(57) ABSTRACT

A magnetic field sensor includes a first sensor bridge circuit including a first plurality of magnetic field sensor elements and a second plurality of magnetic field sensor elements, wherein the first plurality of magnetic field sensor elements are positioned symmetrical to the second plurality of magnetic field sensor elements across a center of symmetry, wherein the first and the second pluralities of magnetic field sensor elements are separated by a first sensor pitch; and a second sensor bridge circuit including a third plurality of magnetic field sensor elements and a fourth plurality of magnetic field sensor elements, wherein the third plurality of magnetic field sensor elements are positioned symmetrical to the fourth plurality of magnetic field sensor elements across the center of symmetry, wherein the third and the fourth pluralities of magnetic field sensor elements are separated by a second sensor pitch that is equal to the first sensor pitch.

24 Claims, 9 Drawing Sheets

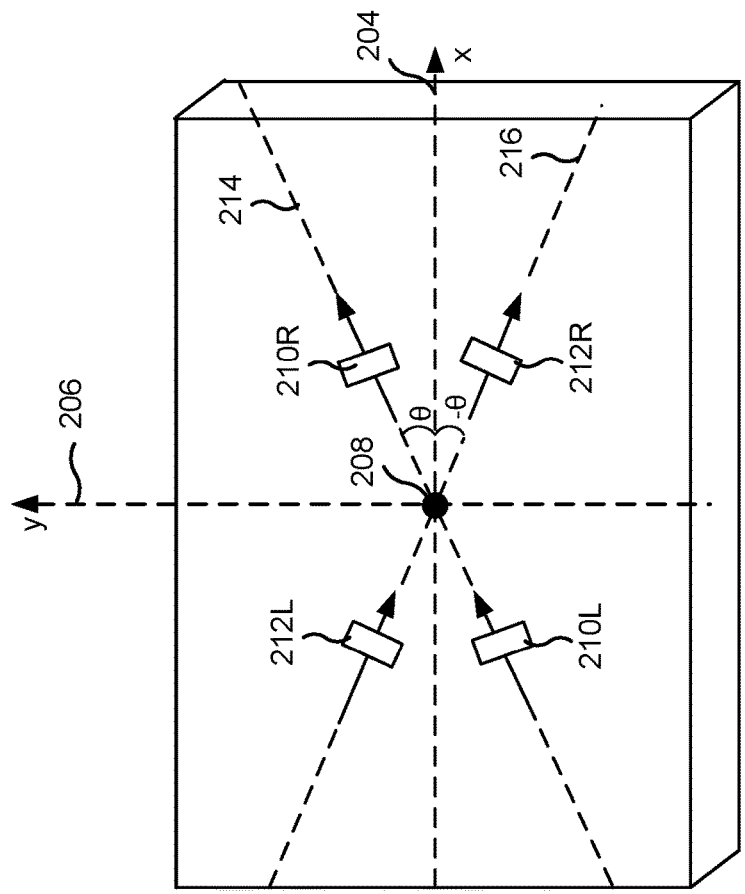
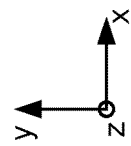
FIG. 2

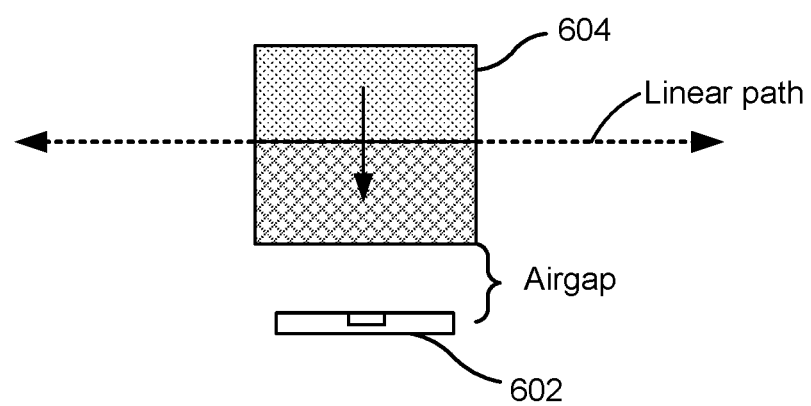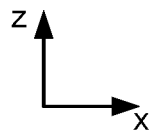
FIG. 6

DUAL CHANNEL MAGNETIC FIELD SENSOR

BACKGROUND

There are many applications in which measuring an electric current is desired. As one example, it may be desired to measure one or more electric currents of a battery system of an electric vehicle. In another example, it may be desired to measure one or more electric currents provided to a load, such as an electric motor. In yet further examples, it may be desired to measure one or more electric currents of a power distribution system or one or more electric currents in a circuit.

Because an electric current flowing through a current-carrying conductor produces a magnetic field with a magnetic field flux density that is proportional to a magnitude of the electric current, magnetic field sensors can be used as current sensors. By placing a magnetic field sensor near the current-carrying conductor, the magnetic field sensor can generate a measurable quantity, such as a voltage, that is proportional to the magnetic field sensed by the magnetic field sensor. However, it is noted that the magnetic field flux density in a space around the current-carrying conductor reduces inversely with increasing distance from the current-carrying conductor. Therefore, a sensor element of the magnetic field sensor is placed in close proximity to the current-carrying conductor.

In addition, a magnetic field sensor may be used to sense a position of an object. As one example, a magnet may be coupled to an object of interest (e.g., a target object). As a result, if the magnetic field sensor is placed in a fixed position, a magnetic field produced by the magnet and sensed at the magnetic field sensor changes as a position of the object changes. For example, a magnetic field flux density of the magnetic field incident on the magnetic field sensor may increase as the object, along with the magnet, moves closer to the magnetic field sensor and may decrease as the object, along with the magnet, moves farther from the magnetic field sensor. Thus, by placing the magnetic field sensor near a trajectory the magnet, the magnetic field sensor can generate a measurable quantity, such as a voltage, that is proportional to the position of the object in connection with the magnetic field produced by the magnet.

SUMMARY

In some implementations, a magnetic field sensor chip includes a chip surface defined by a first dimension that extends along a first axis and a second dimension that extends along a second axis perpendicular to the first axis; a center of symmetry located on the chip surface, wherein the first axis and the second axis intersect the center of symmetry; a first sensor bridge circuit comprising a first plurality of magnetic field sensor elements and a second plurality of magnetic field sensor elements, wherein the first plurality of magnetic field sensor elements are positioned symmetrical to the second plurality of magnetic field sensor elements across the center of symmetry, wherein the first plurality of magnetic field sensor elements are separated from the second plurality of magnetic field sensor elements by a first sensor pitch, wherein the first plurality of magnetic field sensor elements and the second plurality of magnetic field sensor elements are sensitive to a first in-plane component of a magnetic field and are configured to generate a first differential sensor signal based on the first in-plane component of the magnetic field; and a second sensor bridge circuit comprising a third plurality of magnetic field sensor elements and a fourth plurality of magnetic field sensor elements, wherein the third plurality of magnetic field sensor elements are positioned symmetrical to the fourth plurality of magnetic field sensor elements across the center of symmetry, wherein the third plurality of magnetic field sensor elements are separated from the fourth plurality of magnetic field sensor elements by a second sensor pitch that is equal to the first sensor pitch, wherein the third plurality of magnetic field sensor elements and the fourth plurality of magnetic field sensor elements are sensitive to a second in-plane component of the magnetic field and are configured to generate a second differential sensor signal based on the second in-plane component of the magnetic field, wherein the first differential sensor signal and the second differential sensor signal are equal.

In some implementations, a position sensor arrangement includes a magnet configured to produce a magnetic field and further configured to move along a linear path; and a magnetic field sensor chip, comprising: a chip surface defined by a first dimension that extends along a first axis and a second dimension that extends along a second axis perpendicular to the first axis; a center of symmetry located on the chip surface, wherein the first axis and the second axis intersect the center of symmetry; a first sensor bridge circuit comprising a first plurality of magnetic field sensor elements and a second plurality of magnetic field sensor elements, wherein the first plurality of magnetic field sensor elements are positioned symmetrical to the second plurality of magnetic field sensor elements across the center of symmetry, wherein the first plurality of magnetic field sensor elements are separated from the second plurality of magnetic field sensor elements by a first sensor pitch, wherein the first plurality of magnetic field sensor elements and the second plurality of magnetic field sensor elements are sensitive to a first in-plane component of the magnetic field and are configured to generate a first differential sensor signal based on the first in-plane component of the magnetic field; and a second sensor bridge circuit comprising a third plurality of magnetic field sensor elements and a fourth plurality of magnetic field sensor elements, wherein the third plurality of magnetic field sensor elements are positioned symmetrical to the fourth plurality of magnetic field sensor elements across the center of symmetry, wherein the third plurality of magnetic field sensor elements are separated from the fourth plurality of magnetic field sensor elements by a second sensor pitch that is equal to the first sensor pitch, wherein the third plurality of magnetic field sensor elements and the fourth plurality of magnetic field sensor elements are sensitive to a second in-plane component of the magnetic field and are configured to generate a second differential sensor signal based on the second in-plane component of the magnetic field, wherein the first differential sensor signal and the second differential sensor signal are equal, and wherein the first differential sensor signal and the second differential sensor signal are representative of a position of the magnet relative to the magnetic field sensor chip.

In some implementations, a current sensor arrangement includes a conductor configured to carry a current which produces a magnetic field; and a magnetic field sensor chip, comprising: a chip surface defined by a first dimension that extends along a first axis and a second dimension that extends along a second axis perpendicular to the first axis; a center of symmetry located on the chip surface, wherein the first axis and the second axis the center of symmetry intersect the center of symmetry; a first sensor bridge circuit comprising a first plurality of magnetic field sensor elements and a second plurality of magnetic field sensor elements, wherein the first plurality of magnetic field sensor elements are positioned symmetrical to the second plurality of magnetic field sensor elements across the center of symmetry, wherein the first plurality of magnetic field sensor elements are separated from the second plurality of magnetic field sensor elements by a first sensor pitch, wherein the first plurality of magnetic field sensor elements and the second plurality of magnetic field sensor elements are sensitive to a first in-plane component of the magnetic field and are configured to generate a first differential sensor signal based on the first in-plane component of the magnetic field; and a second sensor bridge circuit comprising a third plurality of magnetic field sensor elements and a fourth plurality of magnetic field sensor elements, wherein the third plurality of magnetic field sensor elements are positioned symmetrical to the fourth plurality of magnetic field sensor elements across the center of symmetry, wherein the third plurality of magnetic field sensor elements are separated from the fourth plurality of magnetic field sensor elements by a second sensor pitch that is equal to the first sensor pitch, wherein the third plurality of magnetic field sensor elements and the fourth plurality of magnetic field sensor elements are sensitive to a second in-plane component of the magnetic field and are configured to generate a second differential sensor signal based on the second in-plane component of the magnetic field, wherein the first differential sensor signal and the second differential sensor signal are equal, and wherein the first differential sensor signal and the second differential sensor signal are representative of a measurement of the current.

BRIEF DESCRIPTION OF THE DRAWINGS

Implementations are described herein with reference to the appended drawings.

FIG. 2 illustrates a magnetic field sensor according to one or more implementations.

FIG. 6 illustrates a position sensor arrangement according to one or more implementations.

DETAILED DESCRIPTION

Figure 1:
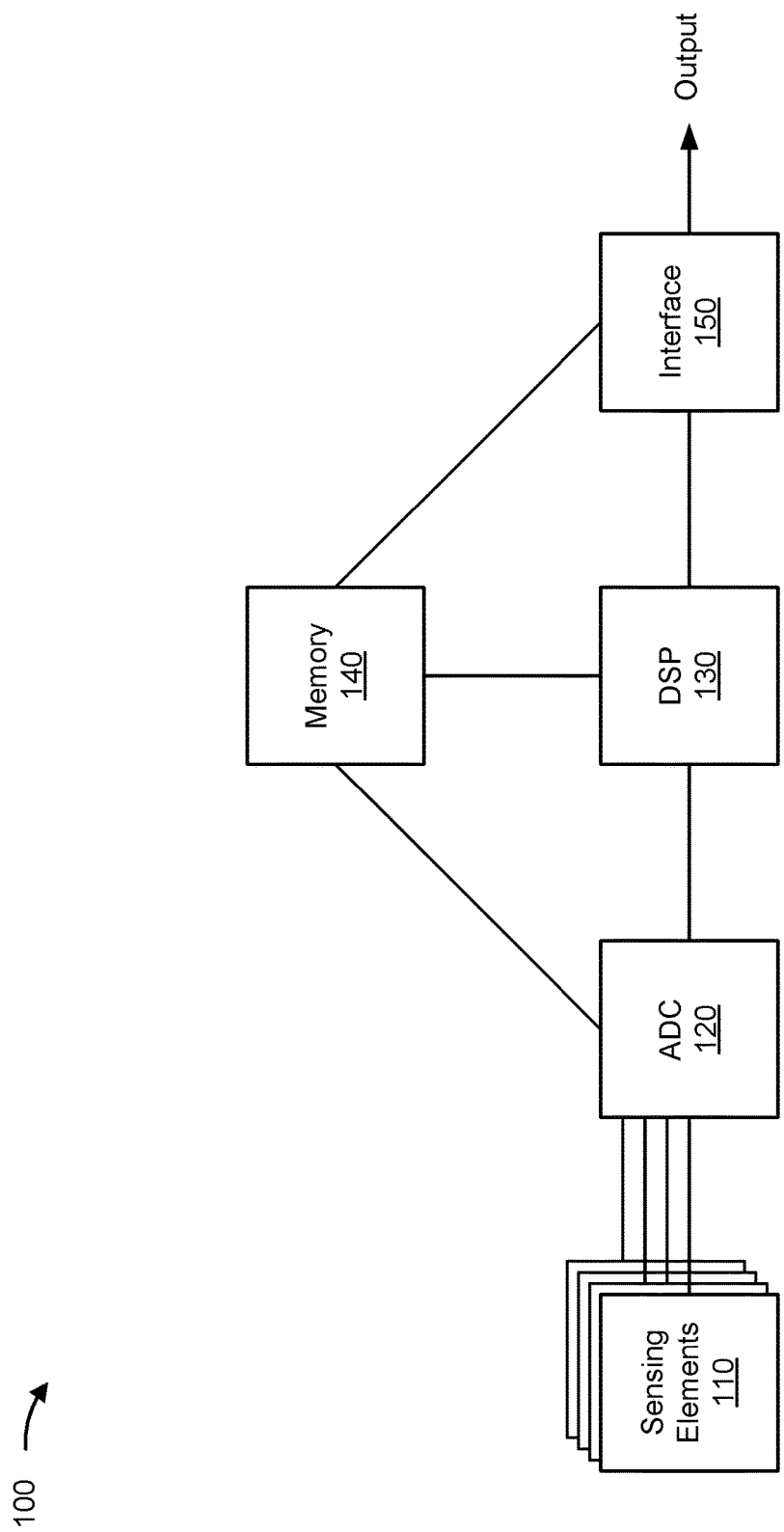
FIG. 1 is a diagram of an example magnetic field sensor according to one or more implementations.

In the following, details are set forth to provide a more thorough explanation of example implementations. However, it will be apparent to those skilled in the art that these implementations may be practiced without these specific details. In other instances, well-known structures and devices are shown in block diagram form or in a schematic view rather than in detail in order to avoid obscuring the implementations. In addition, features of the different implementations described hereinafter may be combined with each other, unless specifically noted otherwise.

Further, equivalent or like elements or elements with equivalent or like functionality are denoted in the following description with equivalent or like reference numerals. As the same or functionally equivalent elements are given the same reference numbers in the figures, a repeated description for elements provided with the same reference numbers may be omitted. Hence, descriptions provided for elements having the same or like reference numbers are mutually exchangeable.

Each of the illustrated x-axis, y-axis, and z-axis is substantially perpendicular to the other two axes. In other words, the x-axis is substantially perpendicular to the y-axis and the z-axis, the y-axis is substantially perpendicular to the x-axis and the z-axis, and the z-axis is substantially perpendicular to the x-axis and the y-axis. In some cases, a single reference number is shown to refer to a surface, or fewer than all instances of a part may be labeled with all surfaces of that part. All instances of the part may include associated surfaces of that part despite not every surface being labeled.

The orientations of the various elements in the figures are shown as examples, and the illustrated examples may be rotated relative to the depicted orientations. The descriptions provided herein, and the claims that follow, pertain to any structures that have the described relationships between various features, regardless of whether the structures are in the particular orientation of the drawings, or are rotated relative to such orientation. Similarly, spatially relative terms, such as "top," "bottom," "below," "beneath," "lower," "above," "upper," "middle," "left," and "right," are used herein for ease of description to describe one element's relationship to one or more other elements as illustrated in the figures. The spatially relative terms are intended to encompass different orientations of the element, structure, and/or assembly in use or operation in addition to the orientations depicted in the figures. A structure and/or assembly may be otherwise oriented (rotated 90 degrees or at other orientations), and the spatially relative descriptors used herein may be interpreted accordingly. Furthermore, the cross-sectional views in the figures only show features within the planes of the cross-sections, and do not show materials behind the planes of the cross-sections, unless indicated otherwise, in order to simplify the drawings.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

In implementations described herein or shown in the drawings, any direct electrical connection or coupling, e.g., any connection or coupling without additional intervening elements, may also be implemented by an indirect connection or coupling, e.g., a connection or coupling with one or more additional intervening elements, or vice versa, as long as the general purpose of the connection or coupling, for example, to transmit a certain kind of signal or to transmit a certain kind of information, is essentially maintained. Features from different implementations may be combined to form further implementations. For example, variations or modifications described with respect to one of the implementations may also be applicable to other implementations unless noted to the contrary.

As used herein, the terms "substantially" and "approximately" mean "within reasonable tolerances of manufacturing and measurement." For example, the terms "substantially" and "approximately" may be used herein to account for small manufacturing tolerances or other factors (e.g., within 5%) that are deemed acceptable in the industry without departing from the aspects of the implementations described herein. For example, a resistor with an approximate resistance value may practically have a resistance within 5% of the approximate resistance value. As another example, an approximate signal value may practically have a signal value within 5% of the approximate signal value.

In the present disclosure, expressions including ordinal numbers, such as "first", "second", and/or the like, may modify various elements. However, such elements are not limited by the above expressions. For example, the above expressions do not limit the sequence and/or importance of the elements. The above expressions are used merely for the purpose of distinguishing an element from the other elements. For example, a first box and a second box indicate different boxes, although both are boxes. For further example, a first element could be termed a second element, and similarly, a second element could also be termed a first element without departing from the scope of the present disclosure.

"Sensor" may refer to a component which converts a property to be measured to an electric signal (e.g., a current signal or a voltage signal). The property to be measured may, for example, comprise a magnetic field, an electric field, an electromagnetic wave (e.g., a radio wave), a pressure, a force, a current, or a voltage, but is not limited thereto. For instance, it will be appreciated that there are various sensor techniques for measuring a current flowing through a conductor or a position of an object in connection with a magnetic field, as will be described below. For example, a system may include a current-carrying conductor that carries a current to be measured. A magnetic field sensor may detect a magnetic field created by the current and generate a sensor signal that is proportional to the magnetic field. Thus, the sensor signal may be a measure for the current.

As another example, a system may include a magnet coupled to a movable target object. The magnet may move relative to a magnetic field sensor as the moveable target object moves along a predetermined path. As the magnet moves closer to the magnetic field sensor, a magnetic field produced by the magnet may become more dense (e.g., more concentrated or stronger) in a region of the magnetic field sensor. Conversely, as the magnet moves farther from the magnetic field sensor, the magnetic field may become less dense (e.g., less concentrated or weaker) in the region of the magnetic field sensor. The magnetic field sensor may detect the magnetic field produced by the magnet and generate a sensor signal that is proportional to the magnetic field. Thus, the sensor signal may be a measure for a position of the magnet relative to the magnetic field sensor.

As another example, a magnet may be coupled to a magnetic field sensor as a back-bias magnet. A movable target object may be configured to influence the magnetic field of the back-bias magnet as the moveable target object moves along a predetermined path. For example, the movable target object may be made of a ferromagnetic material. As a result, the magnetic field may become more dense (e.g., more concentrated or stronger) in a region of the magnetic field sensor as the moveable target object moves closer to the back-bias magnet and may become less dense (e.g., less concentrated or weaker) in the region of the magnetic field sensor as the moveable target object moves farther from the back-bias magnet. The magnetic field sensor may detect the magnetic field produced by the back-bias magnet and generate a sensor signal that is proportional to the magnetic field. Thus, the sensor signal may be a measure for a position of the movable target object relative to the magnetic field sensor.

Magnetic field sensors, such as magnetic field current sensors and magnetic field position sensors, can be used in safety-relevant applications, such as vehicular applications, in which the safety of user may depend on the magnetic field sensors operating correctly to provide reliable sensor information. A failure of a magnetic field sensor in a safety-relevant application may create an unsafe environment for the user or an object used in connection with the magnetic field sensor.

Additionally, homogeneous stray magnetic fields present at a magnetic field sensor may interfere with a magnetic field to be measured. For example, a homogeneous stray magnetic field may be generated by a nearby current rail that is common in electric vehicles or by another magnetic field source. A homogeneous stray magnetic field incident on the magnetic field sensor may cause the magnetic field sensor to output a sensor signal that is not an accurate measurement of the magnetic field to be measured. Thus, sensitivity to homogeneous stray magnetic fields may cause the magnetic field sensor to output unreliable sensor information, which can cause a system that relies on the sensor information to operate incorrectly. Additionally, sensitivity to homogeneous stray magnetic fields may create an unsafe environment for a user or an object used in connection with the magnetic field sensor when the magnetic field sensor is used in safety-relevant applications.

Accordingly, some implementations disclosed herein are directed to a magnetic field sensor that has redundant sensor channels (e.g., redundant magnetic field sensor elements) that may be beneficial for plausibility checks either on an integrated circuit level or on a system level and helps to enable a high diagnostic coverage. For example, in some implementations, the magnetic field sensor may have multiple sets of sensor bridges implemented in a single magnetic field sensor chip. The multiple sets of sensor bridges may provide both redundancy and robustness against homogeneous stray magnetic fields. The redundant sensor channels may be used in safety-relevant applications, such that, if one of the redundant sensor channels fails, the other redundant sensor channel can operate as an identical or a substantially identical replacement. Additionally, redundant sensor channels may be used for performing plausibility checks (e.g., fault checks) on each other in order to detect a faulty operation in one of the redundant sensor channels.

In addition, the sensor bridges may be coupled to provide differential sensing that is capable of rejecting homogeneous stray magnetic fields. In other words, the magnetic field sensor may be configured to provide sensor information that is insensitive to or substantially insensitive to homogeneous stray magnetic fields.

Accordingly, some implementations may provide a stray-field robust dual channel magnetic field sensor that is both robust against sensor faults (e.g., component faults within the magnetic field sensor) and robust against homogeneous stray magnetic fields. This configuration may be achieved without increasing a chip size of the magnetic field sensor such that an impact on manufacturing costs is minimized.

FIG. 1 is a diagram of an example magnetic field sensor 100 according to one or more implementations. As shown in FIG. 1, the magnetic field sensor 100 may include one or more sensing elements 110 (e.g., one or more magnetic field sensing elements), an analog-to-digital convertor (ADC) 120, a digital signal processor (DSP) 130, a memory element 140, and an interface 150.

The magnetic field sensor 100 may be a semiconductor chip (e.g., a sensor chip) that includes the one or more sensing elements 110 that measure or otherwise sense one or more characteristics of a magnetic field (e.g., an amount of magnetic field flux density, a field strength, a field angle, a field direction, a field orientation, etc.) and provide a sensor signal corresponding to the sensed characteristics of the magnetic field. For example, a sensing element 110 may be configured to generate a sensor signal (e.g., a voltage) in response to one or more magnetic fields impinging on the sensing element 110. Thus, the sensor signal is indicative of a magnitude and/or a field orientation of at least one magnetic field impinging on the sensing element 110. The semiconductor chip may further include sensor circuitry for processing and outputting one or more sensor signals generated by the one or more sensing elements 110. In some implementations, the sensing elements 110 may be distributed on two or more semiconductor chips.

The magnetic field may be produced by a magnet, a current-carrying conductor (e.g., a wire, a lead frame, or a busbar), the Earth, or another magnetic field source. A sensing element 110 has a "sensitivity axis" or "sensing axis." The sensing element is sensitive to a magnetic field component of a magnetic field that is projected onto or aligned with the sensitivity axis. Moreover, a sensing element 110 is substantially insensitive to magnetic field components of a magnetic field that are not projected onto or aligned with the sensitivity axis. A magnetic field component may be, for example, an x-magnetic field component Bx, a y-magnetic field component By, or a z-magnetic field component Bz. In the examples described herein, the x-magnetic field component Bx and the y-magnetic field component By are aligned in-plane to the semiconductor chip and the z-magnetic field component Bz is aligned out-of-plane to the semiconductor chip. Accordingly, the x-magnetic field component Bx and the y-magnetic field component By may be referred to as "in-plane" magnetic field components that are aligned parallel to a chip plane (e.g., a chip surface) of the semiconductor chip. In contrast, the z-magnetic field component Bz may be referred to as an "out-of-plane" magnetic field component that extends out of the chip plane (e.g., a chip surface) of the semiconductor chip. For example, the z-magnetic field component Bz extends perpendicular to the chip plane.

In some implementations, the magnetic field sensor 100 includes multiple sensing elements 110 that are sensitive in two or more different directions. For example, the magnetic field sensor 100 may include a first sensing element configured to sense a first magnetic field component (e.g., the x-magnetic field component By), a second sensing element configured to sense a second magnetic field component (e.g., the y-magnetic field component By), and a third Hall-based sensing element configured to sense a third magnetic field component (e.g., the z-magnetic field component Bz). That is, in some implementations, the magnetic field sensor 100 may be a 2D magnetic field sensor or a 3D magnetic field sensor that is configured to sense the magnetic field in multiple dimensions.

The sensing elements 110 may include one or more magnetoresistive-based sensing elements (e.g., magnetoresistive sensing elements) or one or more Hall-based sensing elements (e.g., Hall sensing elements). In some embodiments, the sensing elements 110 may include both one or more magnetoresistive sensing elements and one or more Hall sensing elements.

Magnetoresistance is a property of a magnetoresistive material (e.g., nickel-iron (NiFe)) to change a value of its electrical resistance when a magnetic field is applied to the magnetoresistive material. Thus, the electrical resistance of the magnetoresistive material may depend on a strength and/or a direction of the magnetic field present at the magnetoresistive material. Some examples of various magnetoresistive effects are giant magneto-resistance (GMR), which is a quantum mechanical magnetoresistance effect observed in thin-film structures composed of alternating ferromagnetic and non-magnetic conductive layers; tunnel magneto-resistance (TMR), which is a magnetoresistive effect that occurs in a magnetic tunnel junction (MTJ), which is a component including two ferromagnets separated by a thin insulator; or anisotropic magneto-resistance (AMR), which is a property of a material in which a dependence of electrical resistance on an angle between a direction of electric current and a direction of magnetization is observed. For example, in the case of AMR sensors, a resistance for an AMR sensing element changes according to a square of a sine of an angle of the magnetic field component projected on the sensitivity axis of the ARM sensing element.

The various magnetoresistive effects are commonly abbreviated as xMR, where the "x" acts as a placeholder for the various magnetoresistive effects. xMR sensors can detect the field orientation of an applied magnetic field by measuring sine and cosine angle components with monolithically integrated magnetoresistive sensing elements.

Magnetoresistive sensing elements of such xMR sensors typically include a plurality of layers, of which at least one layer is a reference layer with a reference magnetization (e.g., a reference direction). The reference magnetization provides a sensing direction that defines the sensitivity axis of a magnetoresistive sensing element. This generally means that the sensitivity axis of the magnetoresistive sensing element is parallel to the chip plane defined by a main surface of the semiconductor chip in which the magnetoresistive sensing element is integrated. As a result, a magnetoresistive sensing element is sensitive to the magnetic field component that extends parallel to, or in-plane with, the main surface of the semiconductor chip. Accordingly, if a magnetic field component points exactly in a same direction with respect to the reference direction, a resistance of the magnetoresistive sensing element is at a maximum and, if the magnetic field component points exactly in the opposite direction with respect to the reference direction, the resistance of the magnetoresistive sensing element is at a minimum.

As a result, the resistance or a voltage drop across the magnetoresistive sensing element resulting from the resistance is proportional to the magnetic field and can be used as the sensor signal of the magnetoresistive sensing element. Moreover, in some implementations, an xMR sensor includes a plurality of magnetoresistive sensing elements, which may have the same or different reference magnetizations.

A Hall sensing element is a transducer that varies an output voltage (e.g., a Hall voltage) in response to a magnetic field. The Hall sensing element may be, for example, a Hall plate through which a current is conducted. The output voltage of the Hall sensing element is based on a Hall effect which makes use of a Lorentz force. The Lorentz force deflects moving charges in a presence of the magnetic field which is perpendicular to a current flow through the Hall sensing element (e.g., a Hall plate). Thereby, the sensing element can be a thin piece of semiconductor material or metal. The deflection causes a charge separation, which causes a Hall electrical field. This Hall electrical field acts on the charge in an opposite direction with regard to the Lorentz force. Both forces balance each other and create a potential difference perpendicular to a direction of current flow. The potential difference can be measured as the Hall voltage and varies in a linear relationship with the magnetic field.

There are generally two types of Hall sensing elements, including vertical Hall sensing elements and lateral Hall sensing elements. A vertical Hall sensing element (e.g., a vertical Hall plate) is constructed perpendicular to the chip plane defined by the main surface of the semiconductor chip. In particular, the vertical Hall sensing element may be a conductive plate having a sensor plane that extends "vertically" from the main surface of the semiconductor chip into a chip body of the semiconductor chip. The sensitivity axis of the vertical Hall sensing element is perpendicular to the sensor plane. This generally means that the vertical Hall sensing element is sensitive to the magnetic field component that extends parallel to, or in-plane with, the main surface of the semiconductor chip in which the vertical Hall sensing element is integrated. For the vertical Hall sensing element, a voltage value may be output according to a magnetic field flux density in the direction of its sensitivity axis.

On the other hand, a lateral (planar) Hall sensing element (e.g., a lateral Hall plate) is constructed with a sensor plane that is parallel to the chip plane defined by the main surface of the semiconductor chip. In particular, the lateral Hall sensing element may be a conductive plate having a sensor plane that extends "laterally" along or parallel to the main surface of the semiconductor chip. Since the sensitivity axis of the lateral Hall sensing element is perpendicular to the sensor plane, this generally means that the lateral Hall sensing element is sensitive to magnetic fields vertical, or out-of-plane, to the main surface of the semiconductor chip. For the lateral Hall sensing element, a voltage value may be output according to the magnetic field flux density in the direction of its sensitivity axis.

Accordingly, magnetoresistive sensing elements and vertical Hall sensing elements may be used to measure magnetic fields parallel to the chip plane of the magnetic field sensor 100, and lateral Hall sensing elements may be used to measure magnetic fields perpendicular to the chip plane of the magnetic field sensor 100. Two or more sensing elements and corresponding sensor circuitry may be accommodated (e.g., integrated) in a same semiconductor chip. The sensor circuitry may be referred to as a signal processing circuit and/or a signal conditioning circuit that receives one or more signals (e.g., sensor signals) from one or more sensing elements in the form of raw measurement data, and derives, from the one or more signals, a measurement signal that represents the magnetic field. For example, the sensor circuitry may be configured to condition and amplify the sensor signal of one or more sensing elements 110 via signal processing and/or conditioning.

In some implementations, the sensor circuitry may be configured to combine two or more sensor signals (e.g., by addition, subtraction, or superimposition) to generate a combined sensor signal. For example, a differential signal is one type of combined sensor signal that is representative of a difference between two signals. In some cases, the sensor circuitry may generate a differential sensor signal from the signals generated by two or more sensing elements 110 having a same sensitivity axis (e.g., two sensing elements 110 sensitive to a same magnetic field component) using differential circuitry configured to differentially combine the signals. Sensing elements electrically connected in a half-bridge configuration or in a full-bridge configuration (e.g., a Wheatstone bridge) are examples of differential circuitry that may be used to generate differential sensor signals. Additionally, or alternatively, differential circuitry may include a differential amplifier, an adder, a subtractor, a combiner, logic circuitry, and/or a processor (e.g., a processor that applies differential calculus) to differentially combine the signals to generate a differential sensor signal. A differential measurement signal may provide a robustness to homogeneous external stray magnetic fields.

Notably, the above-described examples of sensing elements 110 are provided for illustrative purposes and, in practice, the sensing elements 110 may include any type of magnetic field sensing element capable of sensing a characteristic of a magnetic field and enabling a sensor signal to be provided to sensor circuitry.

The ADC 120 may include an analog-to-digital converter that converts an analog signal from one or more sensing elements 110 to a digital signal. For example, the ADC 120 may convert analog signals, received from the set of sensing elements 110, into digital signals (e.g., digital samples) to be processed by DSP 130. The ADC 120 may provide the digital signals to DSP 130. In some implementations, magnetic field sensor 100 may include one or more ADCs 120. For example, different ADCs 120 may be configured to receive analog signals from different sets of sensing elements 110.

The DSP 130 may include a digital signal processing device or a collection of digital signal processing devices. In some implementations, the DSP 130 may receive digital signals from the ADC 120 and may process the digital signals to form output signals (e.g., destined for a controller), such as an output signal that conveys sensor data, as described elsewhere herein. In some implementations, the output signals may be referred to as measurement signals.

The memory element 140 may include a read-only memory (ROM) (e.g., an EEPROM), a random-access memory (RAM), and/or another type of dynamic or static storage device (e.g., a flash memory, a magnetic memory, an optical memory, etc.) that stores information and/or instructions for use by magnetic field sensor 100. In some implementations, the memory element 140 may store information associated with processing performed by DSP 130. Additionally, or alternatively, the memory element 140 may store configurational values or parameters for the one or more sensing elements 110 and/or information for one or more other components of magnetic field sensor 100, such as the ADC 120 or the interface 150.

The interface 150 may include an interface via which magnetic field sensor 100 may receive and/or provide information from and/or to another device in a system, such as a controller. For example, the interface 150 may provide the output signal, determined or otherwise generated by DSP 130, to the controller, and may further receive information from the controller. In some implementations, the interface 150 may be a communication interface that receives the output signals from the DSP 130 and provides the output signals as communication signals according to a communication protocol, which may include transmitting the output signals as the communication signals or generating the communication signals based on the output signals.

As indicated above, FIG. 1 is provided merely as an example. Other examples are possible and may differ from what was described with regard to FIG. 1. The number and arrangement of components shown in FIG. 1 are provided as an example. In practice, the magnetic field sensor 100 may include additional components, fewer components, different components, or differently arranged components than those shown in FIG. 1. Two or more components shown in FIG. 1 may be implemented within a single component, or a single component shown in FIG. 1 may be implemented as multiple, distributed components. Additionally, or alternatively, a set of components (e.g., one or more components) of the magnetic field sensor 100 may perform one or more functions described as being performed by another set of components of the magnetic field sensor 100.

FIG. 2 illustrates a magnetic field sensor 200 according to one or more implementations. In some implementations, the magnetic field sensor 200 may be implemented as a position sensor configured to sense a position of a movable target object. In some implementations, the magnetic field sensor 200 may be implemented as a current sensor configured to measure a current.

The magnetic field sensor 200 may be a semiconductor chip that includes a chip surface 202 that defines a chip plane. The chip surface 202 may be defined a first dimension that extends along a first axis 204 (e.g., an x-axis) and a second dimension that extends along a second axis 206 (e.g., a y-axis) perpendicular to the first axis 204. Accordingly, the chip plane may be an x-y plane, and a z-axis may be representative of an out-of-plane axis of the magnetic field sensor 200. Additionally, the magnetic field sensor 200 may include a center of symmetry 208 located on the chip surface 202. The first axis 204 and the second axis 206 may intersect the center of symmetry 208.

The magnetic field sensor 200 may be a magnetic field sensor, as similarly described in connection with FIG. 1, that includes a plurality of magnetic field sensor circuits (e.g., a plurality of sensor bridge circuits), with each magnetic field sensor circuit of the plurality of magnetic field sensor circuits having magnetic field sensor elements coupled in a bridge configuration. In addition, each magnetic field sensor circuit may be representative of a different sensor channel of the magnetic field sensor 200. In this example, the plurality of magnetic field sensor circuits includes a first sensor bridge circuit 210 and a second sensor bridge circuit 212.

The first sensor bridge circuit 210 may include a first plurality of magnetic field sensor elements 210L and a second plurality of magnetic field sensor elements 210R. The first plurality of magnetic field sensor elements 210L may be positioned symmetrical to the second plurality of magnetic field sensor elements 210R across the center of symmetry 208 (e.g., diagonally across the center of symmetry 208). The first plurality of magnetic field sensor elements 210L may be separated from the second plurality of magnetic field sensor elements 210R by a first sensor pitch (e.g., a first distance). Additionally, the first plurality of magnetic field sensor elements 210L and the second plurality of magnetic field sensor elements 210R may be sensitive to a first in-plane component of a magnetic field and may be configured to generate a first differential sensor signal based on the first in-plane component of the magnetic field. In other words, each magnetic field sensor elements of the first plurality of magnetic field sensor elements 210L and the second plurality of magnetic field sensor elements 210R may be sensitive to the first in-plane component of the magnetic field. Because the first plurality of magnetic field sensor elements 210L and the second plurality of magnetic field sensor elements 210R may be sensitive to an in-plane component of a magnetic field, the first plurality of magnetic field sensor elements 210L and the second plurality of magnetic field sensor elements 210R may be, for example, xMR sensor elements or vertical Hall sensor elements.

The second sensor bridge circuit 212 may include a third plurality of magnetic field sensor elements 212L and a fourth plurality of magnetic field sensor elements 212R. The third plurality of magnetic field sensor elements 212L may be positioned symmetrical to the fourth plurality of magnetic field sensor elements 212R across the center of symmetry 208 (e.g., diagonally across the center of symmetry 208). The third plurality of magnetic field sensor elements 212L may be separated from the fourth plurality of magnetic field sensor elements 212R by a second sensor pitch (e.g., a second distance) that is equal to or substantially equal to the first sensor pitch (e.g., the first distance). Additionally, the third plurality of magnetic field sensor elements 212L and the fourth plurality of magnetic field sensor elements 212R may be sensitive to a second in-plane component of the magnetic field and may be configured to generate a second differential sensor signal based on the second in-plane component of the magnetic field. In other words, each magnetic field sensor elements of the third plurality of magnetic field sensor elements 212L and the fourth plurality of magnetic field sensor elements 212R may be sensitive to the second in-plane component of the magnetic field. Because the third plurality of magnetic field sensor elements 212L and the fourth plurality of magnetic field sensor elements 212R may be sensitive to an in-plane component of a magnetic field, the third plurality of magnetic field sensor elements 212L and the fourth plurality of magnetic field sensor elements 212R may be, for example, xMR sensor elements or vertical Hall sensor elements.

The magnetic field sensing elements of the first plurality of magnetic field sensor elements 210L, the second plurality of magnetic field sensor elements 210R, the third plurality of magnetic field sensor elements 212L, and the fourth plurality of magnetic field sensor elements 212R may be arranged on the chip surface 202, embedded at the chip surface 202, and/or arranged to extend into the semiconductor chip from the chip surface 202.

The magnetic field sensor 200 may include a third axis 214 and a fourth axis 216. The third axis 214 may intersect the center of symmetry 208 and may be rotated (e.g., counterclockwise) from the first axis 204 by a positive angle θ that is greater than 0° and less than 90°. The fourth axis 216 may intersect the center of symmetry 208 and may be rotated (e.g., clockwise) from the first axis 204 by a negative angle −θ that is equal in magnitude to the positive angle θ. Therefore, the first plurality of magnetic field sensor elements 210L may be positioned symmetrical to the third plurality of magnetic field sensor elements 212L across the first axis 204, and the second plurality of magnetic field sensor elements 210R may be positioned symmetrical to the fourth plurality of magnetic field sensor elements 212R across the first axis 204.

Each magnetic field sensor element of the first plurality of magnetic field sensor elements 210L and the second plurality of magnetic field sensor elements 210R may have a first respective sensitivity axis that is parallel to the third axis 214. Each magnetic field sensor element of the third plurality of magnetic field sensor elements 212L and the fourth plurality of magnetic field sensor elements 212R may have a second respective sensitivity axis that is parallel to the fourth axis 216. In some implementations, the first respective sensitivity axis may be coincident with the third axis 214 and the second respective sensitivity axis may be coincident with the fourth axis 216.

In some implementations, the positive angle may be greater than 10° and less than 80°. For example, because first plurality of magnetic field sensor elements 210L, the second plurality of magnetic field sensor elements 210R, the third plurality of magnetic field sensor elements 212L, and the fourth plurality of magnetic field sensor elements 212R are equidistant from the center of symmetry 208, the positive angle θ may configured in a range of 10° to 80° such that first plurality of magnetic field sensor elements 210L, the second plurality of magnetic field sensor elements 210R, the third plurality of magnetic field sensor elements 212L, and the fourth plurality of magnetic field sensor elements 212R remain spatially separated from each other.

Due to the symmetry between the first plurality of magnetic field sensor elements 210L, the second plurality of magnetic field sensor elements 210R, the third plurality of magnetic field sensor elements 212L, and the fourth plurality of magnetic field sensor elements 212R about the center of symmetry 208, the first differential sensor signal and the second differential sensor signal are equal or substantially equal. For example, the first plurality of magnetic field sensor elements 210L, the second plurality of magnetic field sensor elements 210R, the third plurality of magnetic field sensor elements 212L, and the fourth plurality of magnetic field sensor elements 212R may be positioned on the chip surface 202 to sense substantially a same magnitude of magnetic field flux density of the magnetic field.

Accordingly, the first differential sensor signal may be an output of a first sensor channel and the second differential sensor signal may be an output of a second sensor channel that is redundant to the first sensor channel. As a result, the first differential sensor signal and the second differential sensor signal may be redundant sensor signals that are interchangeable with each other. The first differential sensor signal and the second differential sensor may be used by the magnetic field sensor 200 to perform plausibility checks to detect faults. In addition, due to the differential spacing of the sensor elements across the center of symmetry 208, the first differential sensor signal and the second differential sensor may be robust against homogeneous stray magnetic fields.

In some implementations, the first plurality of magnetic field sensor elements 210L and the second plurality of magnetic field sensor elements 210R may be electrically coupled to form a first full-bridge that is configured to generate the first differential sensor signal. For example, the first plurality of magnetic field sensor elements 210L may be electrically coupled to form a first half-bridge, and the second plurality of magnetic field sensor elements 210R may be electrically coupled to form a second half-bridge. The first half-bridge and the second half-bridge may be electrically coupled to form the first full-bridge. Alternatively, a first sensor element of the first plurality of magnetic field sensor elements 210L may be electrically coupled with a first sensor element of the second plurality of magnetic field sensor elements 210R to form the first half-bridge, and a second sensor element of the first plurality of magnetic field sensor elements 210L may be electrically coupled with a second sensor element of the second plurality of magnetic field sensor elements 210R to form the second half-bridge.

Similarly, the third plurality of magnetic field sensor elements 212L and the fourth plurality of magnetic field sensor elements 212R may be electrically coupled to form a second full-bridge that is configured to generate the second differential sensor signal. For example, the third plurality of magnetic field sensor elements 212L may be electrically coupled to form a third half-bridge and the fourth plurality of magnetic field sensor elements 212R may be electrically coupled to form a fourth half-bridge. The third half-bridge and the fourth half-bridge may be electrically coupled to form the second full-bridge. Alternatively, a first sensor element of the third plurality of magnetic field sensor elements 212L may be electrically coupled with a first sensor element of the fourth plurality of magnetic field sensor elements 212R to form the third half-bridge, and a second sensor element of the third plurality of magnetic field sensor elements 212L may be electrically coupled with a second sensor element of the fourth plurality of magnetic field sensor elements 212R to form the fourth half-bridge.

In some implementations, the first plurality of magnetic field sensor elements 210L are electrically coupled to form a first full-bridge, the second plurality of magnetic field sensor elements 210R are electrically coupled to form a second full-bridge, the third plurality of magnetic field sensor elements 212L are electrically coupled to form a third full-bridge, and the fourth plurality of magnetic field sensor elements 212R are electrically coupled to form a fourth full-bridge. Each full-bridge may be configured to output a differential sensor signal. Circuitry of the magnetic field sensor 200 may be configured to combine the differential sensor signals of the first full-bridge and the second full-bridge (e.g., by subtraction or differential calculus) to generate the first differential sensor signal. The circuitry of the magnetic field sensor 200 may also be configured to combine the differential sensor signals of the third full-bridge and the fourth full-bridge (e.g., by subtraction or differential calculus) to generate the second differential sensor signal.

As indicated above, FIG. 2 is provided merely as an example. Other examples are possible and may differ from what was described with regard to FIG. 2. The number and arrangement of components shown in FIG. 2 are provided as an example. In practice, the magnetic field sensor 200 may include additional components, fewer components, different components, or differently arranged components than those shown in FIG. 2. Two or more components shown in FIG. 2 may be implemented within a single component, or a single component shown in FIG. 2 may be implemented as multiple, distributed components. Additionally, or alternatively, a set of components (e.g., one or more components) of the magnetic field sensor 200 may perform one or more functions described as being performed by another set of components of the magnetic field sensor 200.

Figure 3A:
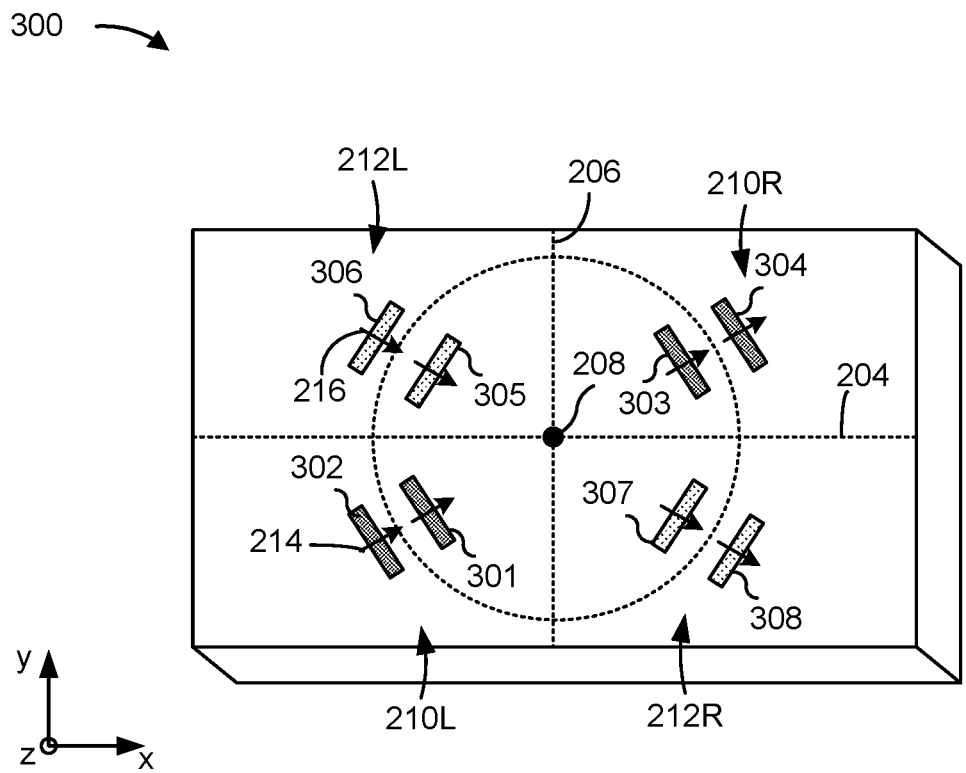
FIG. 3A illustrates a magnetic field sensor according to one or more implementations.

FIG. 3A illustrates a magnetic field sensor 300 according to one or more implementations. The magnetic field sensor 300 is similar to the magnetic field sensor 200 described in connection with FIG. 2. Accordingly, the magnetic field sensor 300 includes the chip surface 202, the first axis 204, the second axis 206, the center of symmetry 208, the first plurality of magnetic field sensor elements 210L, the second plurality of magnetic field sensor elements 210R, the third plurality of magnetic field sensor elements 212L, and the fourth plurality of magnetic field sensor elements 212R as similarly described in connection with FIG. 2.

The first plurality of magnetic field sensor elements 210L may include a first magnetic field sensor element 301 and a second magnetic field sensor element 302. The second plurality of magnetic field sensor elements 210R may include a third magnetic field sensor element 303 and a fourth magnetic field sensor element 304. The third plurality of magnetic field sensor elements 212L may include a fifth magnetic field sensor element 305 and a sixth magnetic field sensor element 306. The fourth plurality of magnetic field sensor elements 212R may include a seventh magnetic field sensor element 307 and an eighth magnetic field sensor element 308. The first magnetic field sensor element 301, the third magnetic field sensor element 303, the fifth magnetic field sensor element 305, and the seventh magnetic field sensor element 307 may be positioned at a first radial distance from the center of symmetry 208. The second magnetic field sensor element 302, the fourth magnetic field sensor element 304, the sixth magnetic field sensor element 306, and eighth magnetic field sensor element 308 may be positioned at a second radial distance from the center of symmetry 208 that is greater than the first radial distance. In other words, the first magnetic field sensor element 301, the third magnetic field sensor element 303, the fifth magnetic field sensor element 305, and the seventh magnetic field sensor element 307 may be equidistance from the center of symmetry 208 such that they sense substantially a same first magnitude of magnetic field flux density of the magnetic field. The second magnetic field sensor element 302, the fourth magnetic field sensor element 304, the sixth magnetic field sensor element 306, and the eighth magnetic field sensor element 308 may be equidistance from the center of symmetry 208 such that they sense substantially a same second magnitude of magnetic field flux density of the magnetic field.

The first plurality of magnetic field sensor elements 210L and the second plurality of magnetic field sensor elements 210R may be electrically coupled to form a first full-bridge that is configured to generate the first differential sensor signal. Similarly, the third plurality of magnetic field sensor elements 212L and the fourth plurality of magnetic field sensor elements 212R may be electrically coupled to form a second full-bridge that is configured to generate the second differential sensor signal.

In addition, the first magnetic field sensor element 301, the second magnetic field sensor element 302, the third magnetic field sensor element 303, and the fourth magnetic field sensor element 304 may be positioned on the third axis 214. The fifth magnetic field sensor element 305, the sixth magnetic field sensor element 306, the seventh magnetic field sensor element 307, and the eighth magnetic field sensor element 308 may be positioned on the fourth axis 216.

In addition, the first magnetic field sensor element 301, the second magnetic field sensor element 302, the third magnetic field sensor element 303, and the fourth magnetic field sensor element 304 each have a first respective sensitivity axis that is coincident with the third axis 214. The fifth magnetic field sensor element 305, the sixth magnetic field sensor element 306, the seventh magnetic field sensor element 307, and the eighth magnetic field sensor element 308 each have a second respective sensitivity axis that is coincident with the fourth axis 216.

The number and arrangement of components shown in FIG. 3A are provided as an example. In practice, the magnetic field sensor 300 may include additional components, fewer components, different components, or differently arranged components than those shown in FIG. 3A.

Figure 3B:
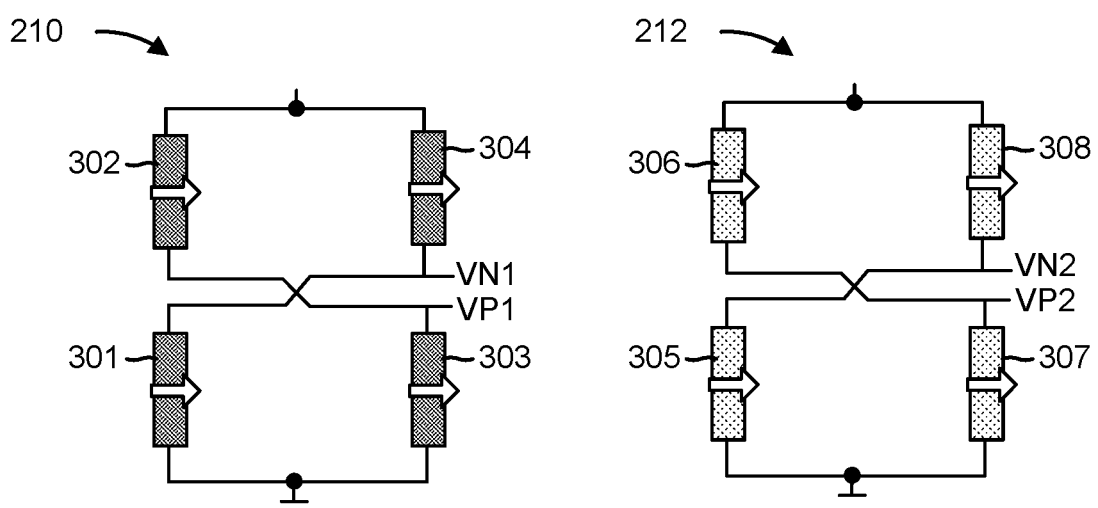
FIG. 3B illustrates a first sensor bridge circuit and a second sensor bridge circuit of the magnetic field sensor illustrated in FIG. 3A according to one or more implementations.

FIG. 3B illustrates a first sensor bridge circuit and a second sensor bridge circuit of the magnetic field sensor 300 illustrated in FIG. 3A according to one or more implementations. For example, the magnetic field sensor 300 may include the first sensor bridge circuit 210 implemented as a first full-bridge and the second sensor bridge circuit 212 implemented as a second full-bridge, as described above in connection with FIGS. 2 and 3A.

The first sensor bridge circuit 210 includes the first magnetic field sensor element 301, the second magnetic field sensor element 302, the third magnetic field sensor element 303, and the fourth magnetic field sensor element 304, which each have a first respective sensitivity axis provided in a same direction. In some implementations, the second magnetic field sensor element 302 and the third magnetic field sensor element 303 are electrically coupled as a first leg (e.g., a first half-bridge) of the first sensor bridge circuit 210, and the first magnetic field sensor element 301 and the fourth magnetic field sensor element 304 are electrically coupled as a second leg (e.g., a second half-bridge) of the first sensor bridge circuit 210. A node between the second magnetic field sensor element 302 and the third magnetic field sensor element 303 may provide a first output potential VP1 of the first sensor bridge circuit 210. A node between the first magnetic field sensor element 301 and the fourth magnetic field sensor element 304 may provide a second output potential VN1 of the first sensor bridge circuit 210. A difference between first output potential VP1 and the second output potential VN1 represents a differential output of the first sensor bridge circuit 210. In other words, the difference between first output potential VP1 and the second output potential VN1 may represent the first differential sensor signal of the first sensor bridge circuit 210. Thus, the first sensor bridge circuit 210 may be configured to provide the first differential sensor signal as one redundant channel signal of the magnetic field sensor 300.

The second sensor bridge circuit 212 includes the fifth magnetic field sensor element 305, the sixth magnetic field sensor element 306, the seventh magnetic field sensor element 307, and the eighth magnetic field sensor element 308, which each have a second respective sensitivity axis provided in a same direction. In some implementations, the sixth magnetic field sensor element 306 and the seventh magnetic field sensor element 307 are electrically coupled as a first leg (e.g., a first half-bridge) of the second sensor bridge circuit 212, and the fifth magnetic field sensor element 305 and the eighth magnetic field sensor element 308 are electrically coupled as a second leg (e.g., a second half-bridge) of the second sensor bridge circuit 212. A node between the sixth magnetic field sensor element 306 and the seventh magnetic field sensor element 307 may provide a first output potential VP2 of the second sensor bridge circuit 212. A node between the fifth magnetic field sensor element 305 and the eighth magnetic field sensor element 308 may provide a second output potential VN2 of the second sensor bridge circuit 212. A difference between first output potential VP2 and the second output potential VN2 represents a differential output of the second sensor bridge circuit 212. In other words, the difference between first output potential VP2 and the second output potential VN2 may represent the second differential sensor signal of the second sensor bridge circuit 212. Thus, the second sensor bridge circuit 212 may be configured to provide the second differential sensor signal as one redundant channel signal of the magnetic field sensor 300. For example, the second differential sensor signal may be identical or substantially identical to the first differential sensor signal to provide signal channel redundancy.

In addition, the first sensor bridge circuit 210 and the second sensor bridge circuit 212 are configured to cancel out any homogeneous stray magnetic fields. Thus, the first differential sensor signal and the second differential sensor signal may not be influenced by any homogeneous stray magnetic fields.

The number and arrangement of components shown in FIG. 3B are provided as an example. In practice, the first sensor bridge circuit 210 and the second sensor bridge circuit 212 may include additional components, fewer components, different components, or differently arranged components than those shown in FIG. 3B.

Figure 4A:
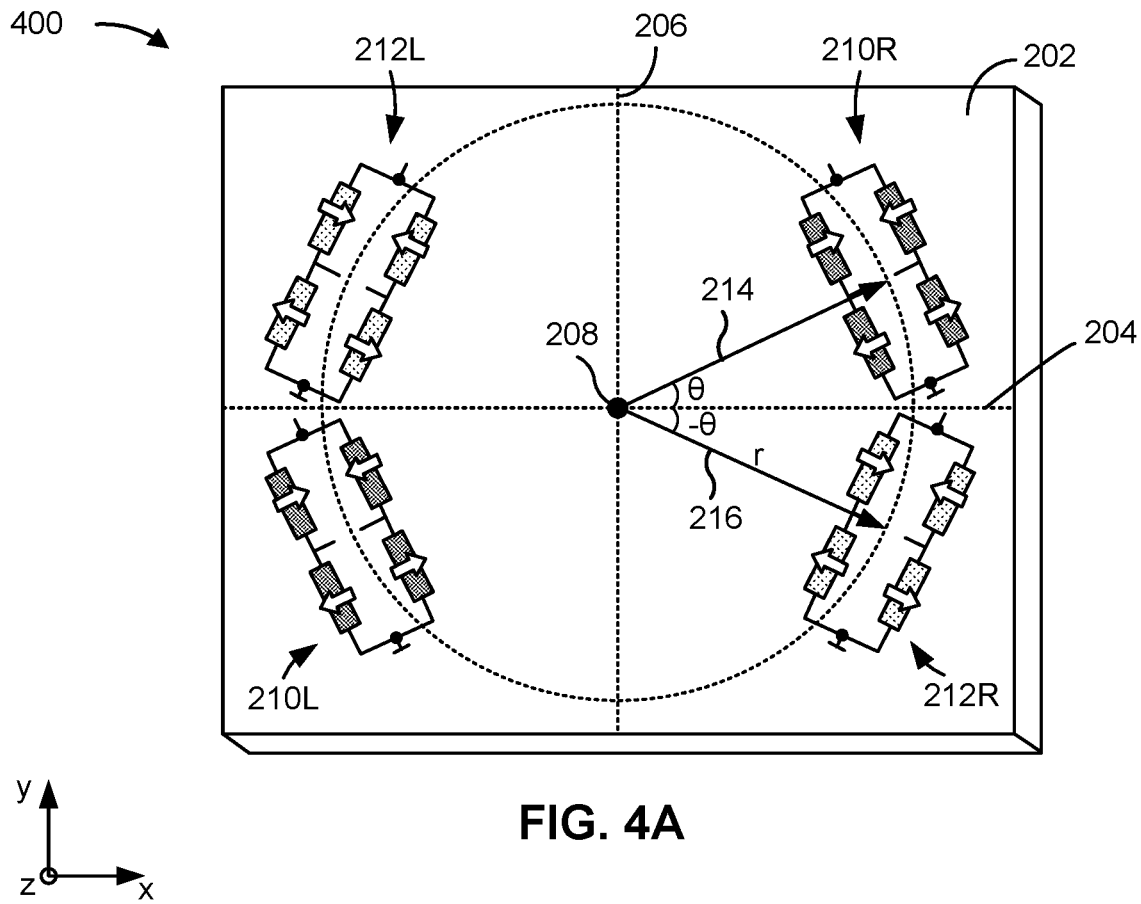
FIG. 4A illustrates a magnetic field sensor according to one or more implementations.

FIG. 4A illustrates a magnetic field sensor 400 according to one or more implementations. The magnetic field sensor 400 is similar to the magnetic field sensor 200 described in connection with FIG. 2. Accordingly, the magnetic field sensor 400 includes the chip surface 202, the first axis 204, the second axis 206, the center of symmetry 208, the first plurality of magnetic field sensor elements 210L, the second plurality of magnetic field sensor elements 210R, the third plurality of magnetic field sensor elements 212L, and the fourth plurality of magnetic field sensor elements 212R as similarly described in connection with FIG. 2.

The first plurality of magnetic field sensor elements 210L may be electrically coupled to form a first full-bridge, the second plurality of magnetic field sensor elements 210R may be electrically coupled to form a second full-bridge, the third plurality of magnetic field sensor elements 212L may be electrically coupled to form a third full-bridge, and the fourth plurality of magnetic field sensor elements 212R may be electrically coupled to form a fourth full-bridge. Thus, the first sensor bridge circuit 210 includes two full-bridges and the second sensor bridge circuit 212 includes two full-bridges.

Additionally, the first full-bridge, the second full-bridge, the third full-bridge, the fourth full-bridge have a same radial distance r from the center of symmetry 208.

The first plurality of magnetic field sensor elements 210L may be arranged symmetrically with respect to the third axis 214. The second plurality of magnetic field sensor elements 210R may be arranged symmetrically with respect to the third axis 214. The third plurality of magnetic field sensor elements 212L may be arranged symmetrically with respect to the fourth axis 216. The fourth plurality of magnetic field sensor elements 212R may be arranged symmetrically with respect to the fourth axis 216.

In addition, each magnetic field sensor element of the first plurality of magnetic field sensor elements 210L and the second plurality of magnetic field sensor elements 210R has a first respective sensitivity axis that is parallel to the third axis 214. Each magnetic field sensor element of the third plurality of magnetic field sensor elements 212L and the fourth plurality of magnetic field sensor elements 212R has a second respective sensitivity axis that is parallel to the fourth axis 216.

The first full-bridge formed by the first plurality of magnetic field sensor elements 210L may be configured to generate a first bridge output signal, the second full-bridge formed by the second plurality of magnetic field sensor elements 210R may be configured to generate a second bridge output signal, third full-bridge formed by the third plurality of magnetic field sensor elements 212L may be configured to generate a third bridge output signal, the fourth full-bridge formed by the fourth plurality of magnetic field sensor elements 212R may be configured to generate a fourth bridge output signal.

The circuitry of the magnetic field sensor 400 may be configured to combine the first bridge output signal and the second bridge output signal of the first full-bridge and the second full-bridge, respectively, to generate the first differential sensor signal. For example, the first bridge output signal and the second bridge output signal maybe combined by subtraction, differential calculus, or differential logic to generate the first differential sensor signal. For example, the first bridge output signal and the second bridge output signal may be combined in an analog domain (e.g., by a subtractor) or in a digital domain (e.g., by the DSP 130). Similarly, the third bridge output signal and the fourth bridge output signal of the third full-bridge and the fourth full-bridge, respectively, to generate the second differential sensor signal. The second differential sensor signal may be identical or substantially identical to the first differential sensor signal to provide signal channel redundancy.

In addition, the first sensor bridge circuit 210 and the second sensor bridge circuit 212 are configured to cancel out any homogeneous stray magnetic fields. Thus, the first differential sensor signal and the second differential sensor signal may not be influenced by any homogeneous stray magnetic fields.

The number and arrangement of components shown in FIG. 4A are provided as an example. In practice, the magnetic field sensor 400 may include additional components, fewer components, different components, or differently arranged components than those shown in FIG. 4A.

Figure 4B:
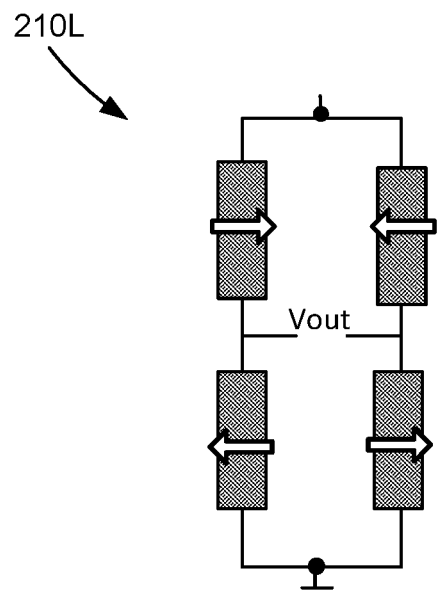
FIG. 4B illustrates a full-bridge of the magnetic field sensor illustrated in FIG. 4A according to one or more implementations.

FIG. 4B illustrates a full-bridge of the magnetic field sensor 400 illustrated in FIG. 4A according to one or more implementations. For example, the full-bridge may be the first full-bridge formed by the first plurality of magnetic field sensor elements 210L. The first plurality of magnetic field sensor elements 210L includes four magnetic field sensor elements electrically coupled in a full-bridge configuration, with a first bridge output signal Vout being generated at the output terminals of each half-bridge. A sensitivity axis and sensitivity of each magnetic field sensor element is also shown.

The number and arrangement of components shown in FIG. 4B are provided as an example. In practice, a full-bridge may include additional components, fewer components, different components, or differently arranged components than those shown in FIG. 4B.

Figure 5:
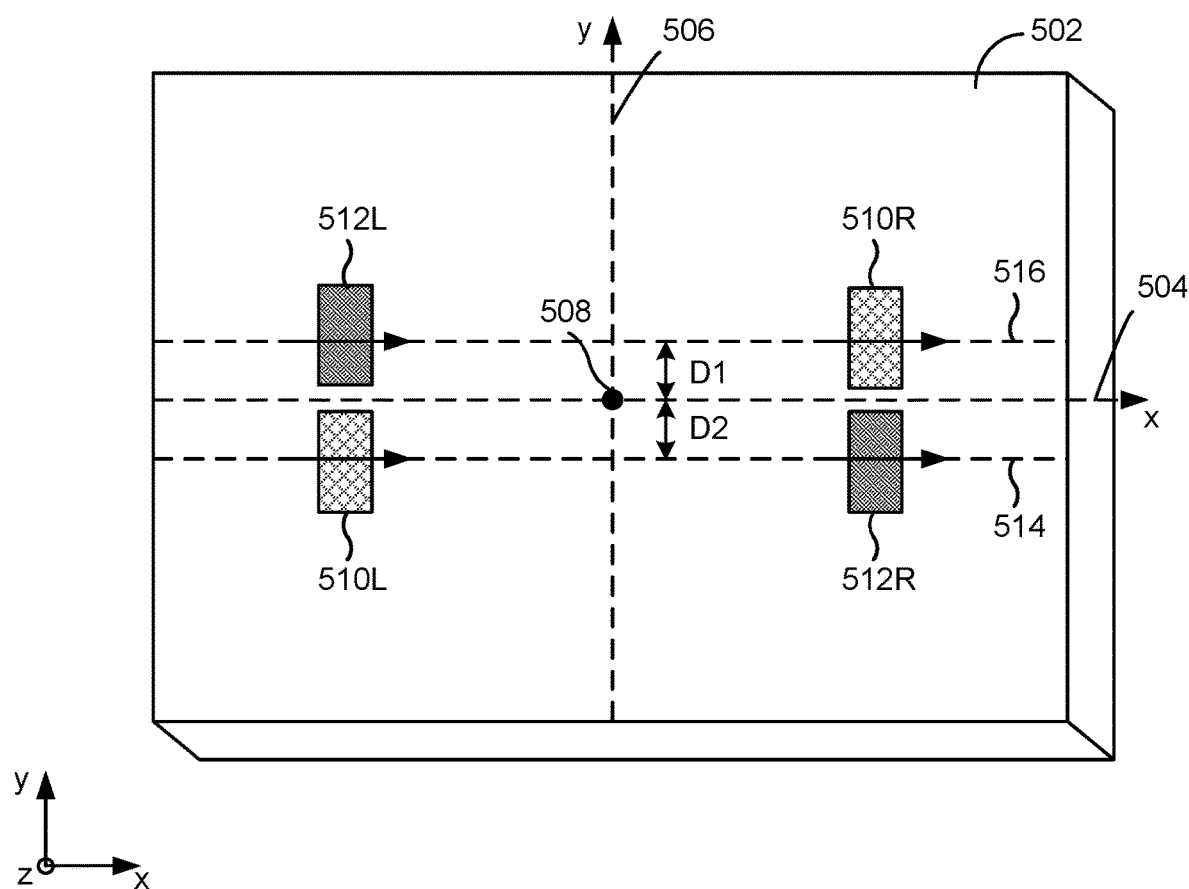
FIG. 5 illustrates a magnetic field sensor according to one or more implementations.

FIG. 5 illustrates a magnetic field sensor 500 according to one or more implementations. In some implementations, the magnetic field sensor 500 may be implemented as a position sensor configured to sense a position of a movable target object. In some implementations, the magnetic field sensor 500 may be implemented as a current sensor configured to measure a current.

The magnetic field sensor 500 may be a semiconductor chip that includes a chip surface 502 that defines a chip plane. The chip surface 502 may be defined a first dimension that extends along a first axis 504 (e.g., an x-axis) and a second dimension that extends along a second axis 506 (e.g., a y-axis) perpendicular to the first axis 504. Accordingly, the chip plane may be an x-y plane, and a z-axis may be representative of an out-of-plane axis of the magnetic field sensor 500. Additionally, the magnetic field sensor 500 may include a center of symmetry 508 located on the chip surface 502. The first axis 504 and the second axis 506 may intersect the center of symmetry 508.

The magnetic field sensor 500 may be a magnetic field sensor, as similarly described in connection with FIG. 1, that includes a plurality of magnetic field sensor circuits (e.g., a plurality of sensor bridge circuits), with each magnetic field sensor circuit of the plurality of magnetic field sensor circuits having magnetic field sensor elements coupled in a bridge configuration. In addition, each magnetic field sensor circuit may be representative of a different sensor channel of the magnetic field sensor 500. In this example, the plurality of magnetic field sensor circuits includes a first sensor bridge circuit 510 and a second sensor bridge circuit 512.

The first sensor bridge circuit 510 includes a first plurality of magnetic field sensor elements 510L and a second plurality of magnetic field sensor elements 510R. The first plurality of magnetic field sensor elements 510L may be positioned symmetrical to the second plurality of magnetic field sensor elements 510R across the center of symmetry 508 (e.g., diagonally across the center of symmetry 508). The first plurality of magnetic field sensor elements 510L may be separated from the second plurality of magnetic field sensor elements 510R by a first sensor pitch (e.g., a first distance). Additionally, the first plurality of magnetic field sensor elements 510L and the second plurality of magnetic field sensor elements 510R may be sensitive to a first in-plane component of a magnetic field and may be configured to generate a first differential sensor signal based on the first in-plane component of the magnetic field. In other words, each magnetic field sensor elements of the first plurality of magnetic field sensor elements 510L and the second plurality of magnetic field sensor elements 510R may be sensitive to the first in-plane component of the magnetic field. Because the first plurality of magnetic field sensor elements 510L and the second plurality of magnetic field sensor elements 510R may be sensitive to an in-plane component of a magnetic field, the first plurality of magnetic field sensor elements 510L and the second plurality of magnetic field sensor elements 510R may be, for example, xMR sensor elements or vertical Hall sensor elements.

The second sensor bridge circuit 512 includes a third plurality of magnetic field sensor elements 512L and a fourth plurality of magnetic field sensor elements 512R. The third plurality of magnetic field sensor elements 512L may be positioned symmetrical to the fourth plurality of magnetic field sensor elements 512R across the center of symmetry 508 (e.g., diagonally across the center of symmetry 508). The third plurality of magnetic field sensor elements 512L may be separated from the fourth plurality of magnetic field sensor elements 512R by a second sensor pitch (e.g., a second distance) that is equal to or substantially equal to the first sensor pitch (e.g., the first distance). Additionally, the third plurality of magnetic field sensor elements 512L and the fourth plurality of magnetic field sensor elements 512R may be sensitive to a second in-plane component of the magnetic field and may be configured to generate a second differential sensor signal based on the second in-plane component of the magnetic field. In other words, each magnetic field sensor elements of the third plurality of magnetic field sensor elements 512L and the fourth plurality of magnetic field sensor elements 512R may be sensitive to the second in-plane component of the magnetic field. Because the third plurality of magnetic field sensor elements 512L and the fourth plurality of magnetic field sensor elements 512R may be sensitive to an in-plane component of a magnetic field, the third plurality of magnetic field sensor elements 512L and the fourth plurality of magnetic field sensor elements 512R may be, for example, xMR sensor elements or vertical Hall sensor elements.

The magnetic field sensing elements of the first plurality of magnetic field sensor elements 510L, the second plurality of magnetic field sensor elements 510R, the third plurality of magnetic field sensor elements 512L, and the fourth plurality of magnetic field sensor elements 512R may be arranged on the chip surface 502, embedded at the chip surface 502, and/or arranged to extend into the semiconductor chip from the chip surface 502.

The magnetic field sensor 500 may include a third axis 514 and a fourth axis 516. The third axis 514 and the fourth axis 516 may extend parallel to the first axis 504. The third axis 514 and the fourth axis 516 may be arranged symmetrically on opposite sides of the first axis 504. Accordingly, the third axis 514 may be offset from the first axis 504 by a negative offset distance D1 and the fourth axis 516 may be offset from the first axis 504 by a positive offset distance D2 that is equal in magnitude to the negative offset distance D1. Therefore, the first plurality of magnetic field sensor elements 510L may be positioned symmetrical to the third plurality of magnetic field sensor elements 512L across the first axis 504, and the second plurality of magnetic field sensor elements 510R may be positioned symmetrical to the fourth plurality of magnetic field sensor elements 512R across the first axis 504.

The magnetic field sensing elements of the first plurality of magnetic field sensor elements 510L, the second plurality of magnetic field sensor elements 510R, the third plurality of magnetic field sensor elements 512L, and the fourth plurality of magnetic field sensor elements 512R may each share a same directional sensitivity. In other words, the magnetic field sensing elements of the first plurality of magnetic field sensor elements 510L, the second plurality of magnetic field sensor elements 510R, the third plurality of magnetic field sensor elements 512L, and the fourth plurality of magnetic field sensor elements 512R may each have a respective sensitivity axis that is aligned in a same direction that is parallel to the first axis 504. Therefore, the magnetic field sensing elements of the first plurality of magnetic field sensor elements 510L, the second plurality of magnetic field sensor elements 510R, the third plurality of magnetic field sensor elements 512L, and the fourth plurality of magnetic field sensor elements 512R may be sensitive to a same in-plane component of the magnetic field.

In some implementations, the first plurality of magnetic field sensor elements 510L and the fourth plurality of magnetic field sensor elements 512R are arranged on the third axis 514. For example, each magnetic field sensor element of the first plurality of magnetic field sensor elements 510L and the fourth plurality of magnetic field sensor elements 512R may be positioned on the third axis 514. Alternatively, the first plurality of magnetic field sensor elements 510L may be arranged symmetrically with respect to the third axis 514 and the fourth plurality of magnetic field sensor elements 512R may be arranged symmetrically with respect to the third axis 514.

In some implementations, the second plurality of magnetic field sensor elements 510R and the third plurality of magnetic field sensor elements 512L are arranged on the fourth axis 516. For example, each magnetic field sensor element of the second plurality of magnetic field sensor elements 510R and the third plurality of magnetic field sensor elements 512L may be positioned on the fourth axis 516. Alternatively, the second plurality of magnetic field sensor elements 510R may be arranged symmetrically with respect to the fourth axis 516 and the third plurality of magnetic field sensor elements 512L may be arranged symmetrically with respect to the fourth axis 516.

In some implementations, the first plurality of magnetic field sensor elements 510L and the second plurality of magnetic field sensor elements 510R may be electrically coupled to form a full-bridge, as similarly described in connection with FIGS. 3A and 3B. Alternatively, the first plurality of magnetic field sensor elements 510L may be electrically coupled to form a first full-bridge and the second plurality of magnetic field sensor elements 510R may be electrically coupled to form a second full-bridge, as similarly described in connection with FIGS. 4A and 4B.

Similarly, in some implementations, the third plurality of magnetic field sensor elements 512L and the fourth plurality of magnetic field sensor elements 512R may be electrically coupled to form another full-bridge, as similarly described in connection with FIGS. 3A and 3B. Alternatively, the third plurality of magnetic field sensor elements 512L may be electrically coupled to form a third full-bridge and the fourth plurality of magnetic field sensor elements 512R may be electrically coupled to form a fourth full-bridge, as similarly described in connection with FIGS. 4A and 4B.

Due to the symmetry between the first plurality of magnetic field sensor elements 510L, the second plurality of magnetic field sensor elements 510R, the third plurality of magnetic field sensor elements 512L, and the fourth plurality of magnetic field sensor elements 512R about the center of symmetry 508, the first differential sensor signal and the second differential sensor signal are equal or substantially equal. For example, the first plurality of magnetic field sensor elements 510L, the second plurality of magnetic field sensor elements 510R, the third plurality of magnetic field sensor elements 512L, and the fourth plurality of magnetic field sensor elements 512R may be positioned on the chip surface 502 to sense substantially a same magnitude of magnetic field flux density of the magnetic field.

Accordingly, the first differential sensor signal may be an output of a first sensor channel and the second differential sensor signal may be an output of a second sensor channel that is redundant to the first sensor channel. As a result, the first differential sensor signal and the second differential sensor signal may be redundant sensor signals that are interchangeable with each other. The first differential sensor signal and the second differential sensor may be used by the magnetic field sensor 500 to perform plausibility checks to detect faults. In addition, due to the differential spacing of the sensor elements across the center of symmetry 508, the first differential sensor signal and the second differential sensor may be robust against homogeneous stray magnetic fields.

As indicated above, FIG. 5 is provided merely as an example. Other examples are possible and may differ from what was described with regard to FIG. 5. The number and arrangement of components shown in FIG. 5 are provided as an example. In practice, the magnetic field sensor 500 may include additional components, fewer components, different components, or differently arranged components than those shown in FIG. 5. Two or more components shown in FIG. 5 may be implemented within a single component, or a single component shown in FIG. 5 may be implemented as multiple, distributed components. Additionally, or alternatively, a set of components (e.g., one or more components) of the magnetic field sensor 500 may perform one or more functions described as being performed by another set of components of the magnetic field sensor 500.

FIG. 6 illustrates a position sensor arrangement 600 according to one or more implementations. The position sensor arrangement 600 includes a magnetic field sensor 602 and a magnet 604. The magnetic field sensor 602 may be any of the above-described magnetic field sensor, including the magnetic field sensor 200, the magnetic field sensor 300, the magnetic field sensor 400, or the magnetic field sensor 500. The magnet 604 may be an axially magnetized magnet that is configured to produce a magnetic field and may be further configured to move along a linear path (e.g., a predetermined or fixed linear path). The linear path may be parallel to an axis (e.g., the first axis 204 or the first axis 504) of the magnetic field sensor 602.

For example, in some implementations, the magnet 604 may be coupled to a moveable target object that is configured to move laterally, side-to-side, with respect to the magnetic field sensor 602. The magnetic field sensor 602 may be arranged with a predetermined airgap from the magnet 604. The airgap may be measured as a minimum distance between the magnetic field sensor 602 and the magnet 604 when the magnet 604 is arranged directly over the magnetic field sensor 602.

A magnetic field flux density of the magnetic field present at the magnetic field sensor 602 corresponds to a position of the magnet 604 relative to the magnetic field sensor 602. For example, as the magnet 604 moves closer to the magnetic field sensor 602, the magnetic field produced by the magnet 604 may become more dense (e.g., more concentrated or stronger) in a region of the magnetic field sensor 602. Conversely, as the magnet 604 moves farther from the magnetic field sensor, the magnetic field may become less dense (e.g., less concentrated or weaker) in the region of the magnetic field sensor 602.

Thus, the magnetic field sensor 602 may detect the magnetic field produced by the magnet 604 and generate the first differential sensor signal and the second differential sensor signal, as redundant sensor signals, that are proportional to the magnetic field. For example, values of the first differential sensor signal and the second differential sensor signal may be unique to the position of the magnetic 604 on the linear path. Thus, the first differential sensor signal and the second differential sensor signal may be representative of a lateral position of the magnet 604 relative to the magnetic field sensor 602.

The number and arrangement of components shown in FIG. 6 are provided as an example. In practice, the position sensor arrangement 600 may include additional components, fewer components, different components, or differently arranged components than those shown in FIG. 6.

Figure 7:
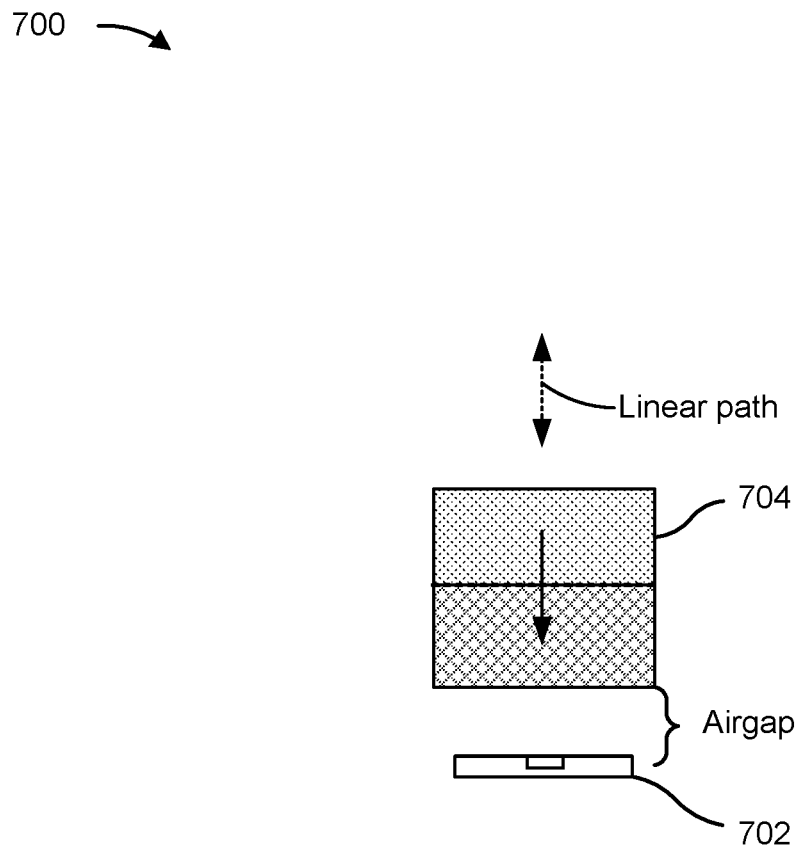
FIG. 7 illustrates a position sensor arrangement according to one or more implementations.

FIG. 7 illustrates a position sensor arrangement 700 according to one or more implementations. The position sensor arrangement 700 includes a magnetic field sensor 702 and a magnet 704. The magnetic field sensor 702 may be any of the above-described magnetic field sensor, including the magnetic field sensor 200, the magnetic field sensor 300, the magnetic field sensor 400, or the magnetic field sensor 500. The magnet 704 may be an axially magnetized magnet that is configured to produce a magnetic field and may be further configured to move along a linear path (e.g., a predetermined or fixed linear path). The linear path may be parallel to an out-of-plane axis (e.g., a z-axis) of the magnetic field sensor 702. Therefore, the linear path may be perpendicular to an x-axis and a y-axis of the magnetic field sensor 702.

For example, in some implementations, the magnet 704 may be coupled to a moveable target object that is configured to move vertically with respect to the magnetic field sensor 702. Accordingly, an airgap between the magnetic field sensor 702 and the magnet 704 may change as the magnet 704 changes position on the linear path. The airgap may be measured as a minimum distance between the magnetic field sensor 702 and the magnet 704 when the magnet 704 is arranged directly over the magnetic field sensor 702.

A magnetic field flux density of the magnetic field present at the magnetic field sensor 702 corresponds to a position of the magnet 704 relative to the magnetic field sensor 702. For example, as the magnet 704 moves closer to the magnetic field sensor 702, the magnetic field produced by the magnet 704 may become more dense (e.g., more concentrated or stronger) in a region of the magnetic field sensor 702.

Conversely, as the magnet 704 moves farther from the magnetic field sensor, the magnetic field may become less dense (e.g., less concentrated or weaker) in the region of the magnetic field sensor 702.

Thus, the magnetic field sensor 702 may detect the magnetic field produced by the magnet 704 and generate the first differential sensor signal and the second differential sensor signal, as redundant sensor signals, that are proportional to the magnetic field. For example, values of the first differential sensor signal and the second differential sensor signal may be unique to the position of the magnetic 704 on the linear path. Thus, the first differential sensor signal and the second differential sensor signal may be representative of a vertical position of the magnet 704 relative to the magnetic field sensor 702.

The number and arrangement of components shown in FIG. 7 are provided as an example. In practice, the position sensor arrangement 700 may include additional components, fewer components, different components, or differently arranged components than those shown in FIG. 7.

Figure 8:
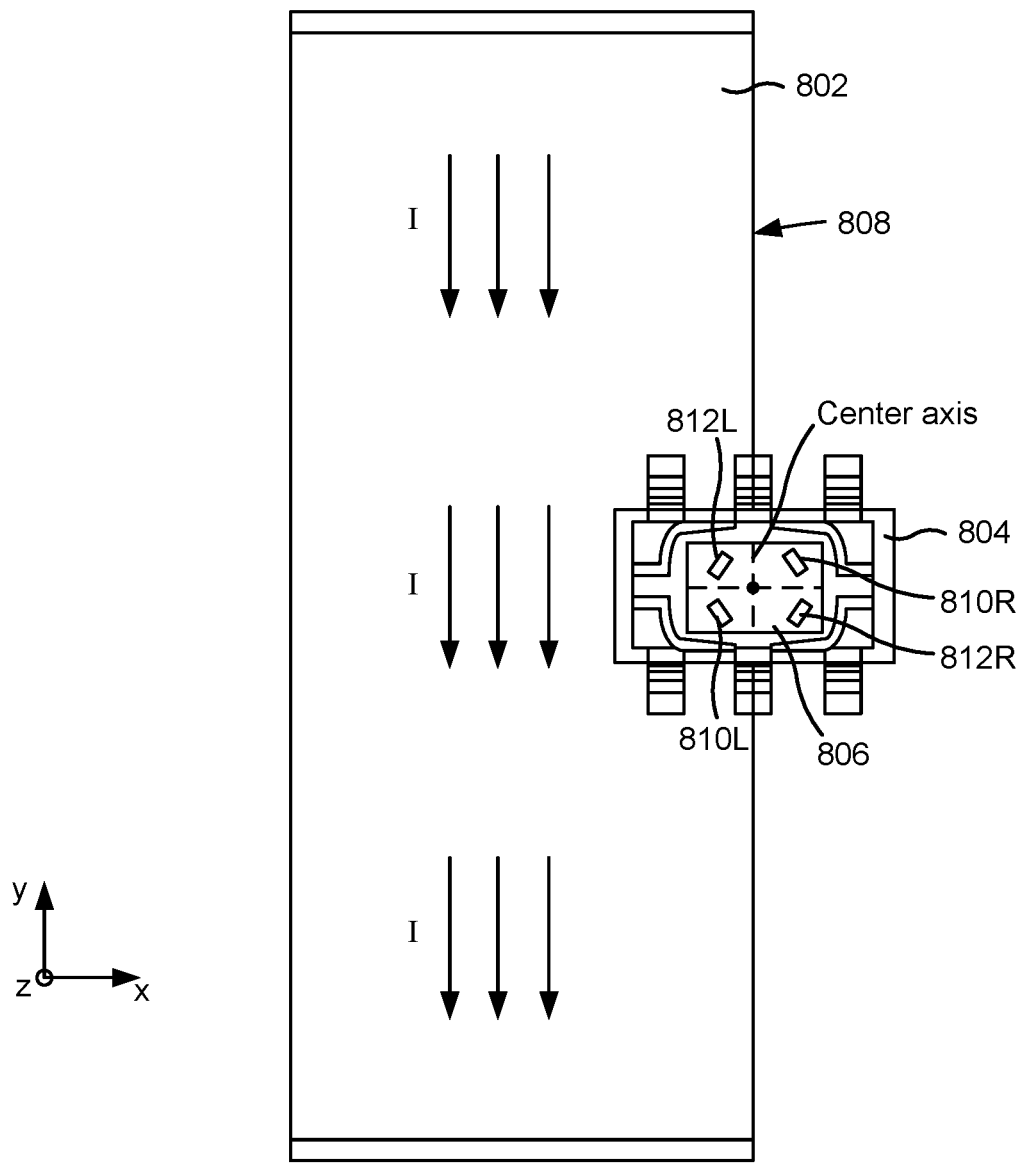
FIG. 8 illustrates a current sensor arrangement according to one or more implementations.

FIG. 8 illustrates a current sensor arrangement 800 according to one or more implementations. The current sensor arrangement 800 may include a conductor 802 configured to carry a current I which produces a magnetic field and a chip package 804 that includes a magnetic field sensor 806 (e.g., a magnetic field sensor chip). The magnetic field sensor 806 may be similar to the magnetic field sensors 200, 300, 400, or 500 described above in connection with FIGS. 2, 3A, 3B, 4A, 4B, and 5, respectively.

The conductor 802 may be a current rail, a bus bar, or another conductor that carries a current I to be measured. The conductor 802 includes a conductor edge 808 that extends parallel to a current flow direction of the current I. The magnetic field sensor 806 is arranged relative to the conductor 802 such that a center axis (e.g., second axis 206 or 506) of the magnetic field sensor 806 is substantially centered over the conductor edge 808 of the conductor 802 and extends parallel to the current flow direction of the current I. In other words, a center of symmetry of the magnetic field sensor 806 overlaps with the conductor edge 808 of the conductor 802 in the out-of-plane direction of the magnetic field sensor 806 (e.g., the z-direction).

The magnetic field sensor 806 includes a first plurality of magnetic field sensor elements 810L, a second plurality of magnetic field sensor elements 810R, a third plurality of magnetic field sensor elements 812L, and a fourth plurality of magnetic field sensor elements 812R. For example, the first plurality of magnetic field sensor elements 810L, the second plurality of magnetic field sensor elements 810R, the third plurality of magnetic field sensor elements 812L, and the fourth plurality of magnetic field sensor elements 812R may be similar to the first plurality of magnetic field sensor elements 210L, the second plurality of magnetic field sensor elements 210R, the third plurality of magnetic field sensor elements 212L, and the fourth plurality of magnetic field sensor elements 212R, respectively.

The first plurality of magnetic field sensor elements 810L and the third plurality of magnetic field sensor elements 812L may be displaced from the center axis of the magnetic field sensor 806 such that the first plurality of magnetic field sensor elements 810L and the third plurality of magnetic field sensor elements 812L overlap with the conductor 802 in the out-of-plane direction (e.g., in the z-direction). The second plurality of magnetic field sensor elements 810R and the fourth plurality of magnetic field sensor elements 812R may be displaced from the center axis of the magnetic field sensor 806 such that the second plurality of magnetic field sensor elements 810R and the fourth plurality of magnetic field sensor elements 812R do not overlap with the conductor 802 in the out-of-plane direction. Accordingly, two sensor channels of the magnetic field sensor 806 are each configured to sense a differential magnetic field produced by the current I flowing through the conductor 802 independently of each other.

The magnetic field sensor 806 may be configured to generate the first differential sensor signal and the second differential sensor signal as similarly described above. In this example, the magnetic field is proportional to an amount of current flowing through the conductor 802. Thus, the first differential sensor signal and the second differential sensor signal may be representative of a measurement of the current I.

The number and arrangement of components shown in FIG. 8 are provided as an example. In practice, the current sensor arrangement 800 may include additional components, fewer components, different components, or differently arranged components than those shown in FIG. 8.

Figure 9:
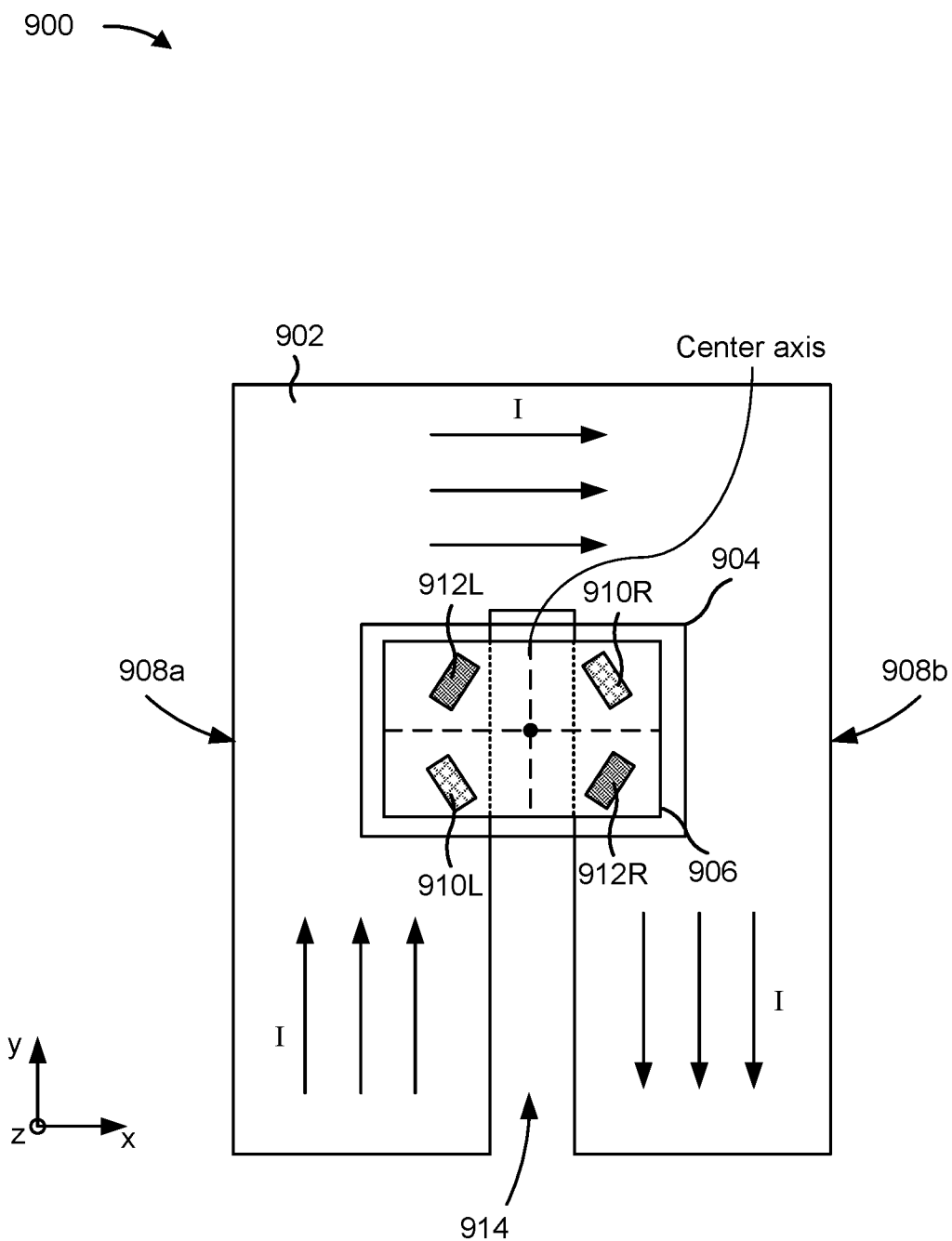
FIG. 9 illustrates a current sensor arrangement according to one or more implementations.

FIG. 9 illustrates a current sensor arrangement 900 according to one or more implementations. The current sensor arrangement 900 may include a conductor 902 configured to carry a current I which produces a magnetic field and a chip package 904 that includes a magnetic field sensor 906 (e.g., a magnetic field sensor chip). The magnetic field sensor 906 may be similar to the magnetic field sensors 200, 300, 400, or 500 described above in connection with FIGS. 2, 3A, 3B, 4A, 4B, and 5, respectively.

The conductor 902 may be a current rail, a bus bar, or another conductor having a U-shape that carries a current I to be measured. The conductor 902 includes a first conductor segment 908a that is configured to carry the current I in a first current direction that is parallel to the y-axis and a second conductor segment 908b that is configured to carry the current I in a second current direction that is antiparallel (e.g., opposite) to the first current direction.

The magnetic field sensor 906 includes a first plurality of magnetic field sensor elements 910L, a second plurality of magnetic field sensor elements 910R, a third plurality of magnetic field sensor elements 912L, and a fourth plurality of magnetic field sensor elements 912R. For example, the first plurality of magnetic field sensor elements 910L, the second plurality of magnetic field sensor elements 910R, the third plurality of magnetic field sensor elements 912L, and the fourth plurality of magnetic field sensor elements 912R may be similar to the first plurality of magnetic field sensor elements 210L, the second plurality of magnetic field sensor elements 210R, the third plurality of magnetic field sensor elements 212L, and the fourth plurality of magnetic field sensor elements 212R, respectively.

A center axis (e.g., second axis 206 or 506) of the magnetic field sensor 906 may be arranged over a gap 914 in an out-of-plane direction of the magnetic field sensor 906 (e.g., the z-direction). The gap 914 is laterally interposed between the first conductor segment 908a and the second conductor segment 908b (e.g., along the x-axis). Thus, the center axis of magnetic field sensor 906 may be centered over the gap 914 such that the magnetic field sensor 906 is symmetrically arranged over the conductor 902.

The first plurality of magnetic field sensor elements 910L and the third plurality of magnetic field sensor elements 912L may be displaced from the center axis such that the first plurality of magnetic field sensor elements 910L and the third plurality of magnetic field sensor elements 912L overlap with the first conductor segment 908a in the out-of-plane direction. The second plurality of magnetic field sensor elements 910R and the fourth plurality of magnetic field sensor elements 912R may be displaced from the center axis such that the second plurality of magnetic field sensor elements 910R and the fourth plurality of magnetic field sensor elements 912R overlap with the second conductor segment 908b in the out-of-plane direction. Accordingly, two sensor channels of the magnetic field sensor 906 are each configured to sense a differential magnetic field produced by the current I flowing through the conductor 902 independently of each other.

The magnetic field sensor 906 may be configured to generate the first differential sensor signal and the second differential sensor signal as similarly described above. In this example, the magnetic field is proportional to an amount of current flowing through the conductor 902. Thus, the first differential sensor signal and the second differential sensor signal may be representative of a measurement of the current I.

The number and arrangement of components shown in FIG. 9 are provided as an example. In practice, the current sensor arrangement 900 may include additional components, fewer components, different components, or differently arranged components than those shown in FIG. 9.

The following provides an overview of some Aspects of the present disclosure:

Aspect 1: A magnetic field sensor chip, comprising: a chip surface defined by a first dimension that extends along a first axis and a second dimension that extends along a second axis perpendicular to the first axis; a center of symmetry located on the chip surface, wherein the first axis and the second axis intersect the center of symmetry; a first sensor bridge circuit comprising a first plurality of magnetic field sensor elements and a second plurality of magnetic field sensor elements, wherein the first plurality of magnetic field sensor elements are positioned symmetrical to the second plurality of magnetic field sensor elements across the center of symmetry, wherein the first plurality of magnetic field sensor elements are separated from the second plurality of magnetic field sensor elements by a first sensor pitch, wherein the first plurality of magnetic field sensor elements and the second plurality of magnetic field sensor elements are sensitive to a first in-plane component of a magnetic field and are configured to generate a first differential sensor signal based on the first in-plane component of the magnetic field; and a second sensor bridge circuit comprising a third plurality of magnetic field sensor elements and a fourth plurality of magnetic field sensor elements, wherein the third plurality of magnetic field sensor elements are positioned symmetrical to the fourth plurality of magnetic field sensor elements across the center of symmetry, wherein the third plurality of magnetic field sensor elements are separated from the fourth plurality of magnetic field sensor elements by a second sensor pitch that is equal to the first sensor pitch, wherein the third plurality of magnetic field sensor elements and the fourth plurality of magnetic field sensor elements are sensitive to a second in-plane component of the magnetic field and are configured to generate a second differential sensor signal based on the second in-plane component of the magnetic field, wherein the first differential sensor signal and the second differential sensor signal are equal.

Aspect 2: The magnetic field sensor chip of Aspect 1, wherein the first plurality of magnetic field sensor elements, the second plurality of magnetic field sensor elements, the third plurality of magnetic field sensor elements, and the fourth plurality of magnetic field sensor elements are magnetoresistive sensor elements or vertical Hall sensor elements.

Aspect 3: The magnetic field sensor chip of any of Aspects 1-2, wherein the first plurality of magnetic field sensor elements and the second plurality of magnetic field sensor elements are electrically coupled to form a first full-bridge configured to generate the first differential sensor signal, and wherein the third plurality of magnetic field sensor elements and the fourth plurality of magnetic field sensor elements are electrically coupled to form a second full-bridge configured to generate the second differential sensor signal.

Aspect 4: The magnetic field sensor chip of any of Aspects 1-3, wherein the first plurality of magnetic field sensor elements are electrically coupled to form a first full-bridge, the second plurality of magnetic field sensor elements are electrically coupled to form a second full-bridge, the third plurality of magnetic field sensor elements are electrically coupled to form a third full-bridge, and the fourth plurality of magnetic field sensor elements are electrically coupled to form a fourth full-bridge.

Aspect 5: The magnetic field sensor chip of any of Aspects 1-4, wherein each magnetic field sensor element of the first plurality of magnetic field sensor elements and the second plurality of magnetic field sensor elements is positioned on a third axis that intersects the center of symmetry and that is rotated from the first axis by a positive angle, wherein the positive angle is greater than 0° and less than 90°, and wherein each magnetic field sensor element of the third plurality of magnetic field sensor elements and the fourth plurality of magnetic field sensor elements is positioned on a fourth axis that intersects the center of symmetry and that is rotated from the first axis by a negative angle that is equal in magnitude to the positive angle.

Aspect 6: The magnetic field sensor chip of Aspect 5, wherein each magnetic field sensor element of the first plurality of magnetic field sensor elements and the second plurality of magnetic field sensor elements has a first respective sensitivity axis that is coincident with the third axis, and wherein each magnetic field sensor element of the third plurality of magnetic field sensor elements and the fourth plurality of magnetic field sensor elements has a second respective sensitivity axis that is coincident with the fourth axis.

Aspect 7: The magnetic field sensor chip of Aspect 5, wherein the first plurality of magnetic field sensor elements includes a first magnetic field sensor element and a second magnetic field sensor element, wherein the second plurality of magnetic field sensor elements includes a third magnetic field sensor element and a fourth magnetic field sensor element, wherein the third plurality of magnetic field sensor elements includes a fifth magnetic field sensor element and a sixth magnetic field sensor element, wherein the fourth plurality of magnetic field sensor elements includes a seventh magnetic field sensor element and an eighth magnetic field sensor element, wherein the first magnetic field sensor element, the third magnetic field sensor element, fifth magnetic field sensor element, and seventh magnetic field sensor element are positioned at a first radial distance from the center of symmetry, and wherein the second magnetic field sensor element, the fourth magnetic field sensor element, sixth magnetic field sensor element, and eighth magnetic field sensor element are positioned at a second radial distance from the center of symmetry that is greater than the first radial distance.

Aspect 8: The magnetic field sensor chip of Aspect 5, wherein the positive angle is greater than 10° and less than 80°.

Aspect 9: The magnetic field sensor chip of any of Aspects 1-8, wherein the first plurality of magnetic field sensor elements, the second plurality of magnetic field sensor elements, the third plurality of magnetic field sensor elements, and the fourth plurality of magnetic field sensor elements are positioned on the chip surface to sense substantially a same magnitude of magnetic field flux density of the magnetic field.

Aspect 10: The magnetic field sensor chip of any of Aspects 1-9, further comprising: a third axis that intersects the center of symmetry and that is rotated from the first axis by a positive angle, wherein the positive angle is greater than 0° and less than 90°; and a fourth axis that intersects the center of symmetry and that is rotated from the first axis by a negative angle that is equal in magnitude to the positive angle, wherein each magnetic field sensor element of the first plurality of magnetic field sensor elements and the second plurality of magnetic field sensor elements has a first respective sensitivity axis that is parallel to the third axis, and wherein each magnetic field sensor element of the third plurality of magnetic field sensor elements and the fourth plurality of magnetic field sensor elements has a second respective sensitivity axis that is parallel to the fourth axis.

Aspect 11: The magnetic field sensor chip of Aspect 10, wherein the first plurality of magnetic field sensor elements are electrically coupled to form a first full-bridge, the second plurality of magnetic field sensor elements are electrically coupled to form a second full-bridge, the third plurality of magnetic field sensor elements are electrically coupled to form a third full-bridge, and the fourth plurality of magnetic field sensor elements are electrically coupled to form a fourth full-bridge, wherein the first full-bridge, the second full-bridge, the third full-bridge, the fourth full-bridge have a same radial distance from the center of symmetry.

Aspect 12: The magnetic field sensor chip of Aspect 10, wherein the positive angle is greater than 10° and less than 80°.

Aspect 13: The magnetic field sensor chip of Aspect 10, wherein the third axis and the fourth axis are in a chip plane defined by the first axis and the second axis.

Aspect 14: The magnetic field sensor chip of any of Aspects 1-13, wherein each magnetic field sensor element of the first plurality of magnetic field sensor elements and the third plurality of magnetic field sensor elements is positioned on a third axis that is parallel to the first axis and that is offset from the center of symmetry along the second axis by a positive offset distance, wherein each magnetic field sensor element of the second plurality of magnetic field sensor elements and the fourth plurality of magnetic field sensor elements is positioned on a fourth axis that is parallel to the first axis and that is offset from the center of symmetry along the second axis by a negative offset distance that is equal in magnitude to the positive offset distance.

Aspect 15: The magnetic field sensor chip of Aspect 14, wherein each magnetic field sensor element of the first plurality of magnetic field sensor elements and the third plurality of magnetic field sensor elements has a first respective sensitivity axis that is coincident with the third axis, and wherein each magnetic field sensor element of the second plurality of magnetic field sensor elements and the fourth plurality of magnetic field sensor elements has a second respective sensitivity axis that is coincident with the fourth axis.

Aspect 16: The magnetic field sensor chip of any of Aspects 1-15, further comprising: a third axis that is parallel to the first axis and that is offset from the center of symmetry along the second axis by a positive offset distance; and a fourth axis that is parallel to the first axis and that is offset from the center of symmetry along the second axis by a negative offset distance that is equal in magnitude to the positive offset distance, wherein the first plurality of magnetic field sensor elements are arranged symmetrically about the third axis, wherein the third plurality of magnetic field sensor elements are arranged symmetrically about the third axis, wherein the second plurality of magnetic field sensor elements are arranged symmetrically about the fourth axis, and wherein the fourth plurality of magnetic field sensor elements are arranged symmetrically about the fourth axis.

Aspect 17: The magnetic field sensor chip of Aspect 16, wherein each magnetic field sensor element of the first plurality of magnetic field sensor elements, the second plurality of magnetic field sensor elements, the third plurality of magnetic field sensor elements, and the fourth plurality of magnetic field sensor elements have a same direction of sensitivity.

Aspect 18: A position sensor arrangement, comprising: a magnet configured to produce a magnetic field and further configured to move along a linear path; and a magnetic field sensor chip, comprising: a chip surface defined by a first dimension that extends along a first axis and a second dimension that extends along a second axis perpendicular to the first axis; a center of symmetry located on the chip surface, wherein the first axis and the second axis intersect the center of symmetry; a first sensor bridge circuit comprising a first plurality of magnetic field sensor elements and a second plurality of magnetic field sensor elements, wherein the first plurality of magnetic field sensor elements are positioned symmetrical to the second plurality of magnetic field sensor elements across the center of symmetry, wherein the first plurality of magnetic field sensor elements are separated from the second plurality of magnetic field sensor elements by a first sensor pitch, wherein the first plurality of magnetic field sensor elements and the second plurality of magnetic field sensor elements are sensitive to a first in-plane component of the magnetic field and are configured to generate a first differential sensor signal based on the first in-plane component of the magnetic field; and a second sensor bridge circuit comprising a third plurality of magnetic field sensor elements and a fourth plurality of magnetic field sensor elements, wherein the third plurality of magnetic field sensor elements are positioned symmetrical to the fourth plurality of magnetic field sensor elements across the center of symmetry, wherein the third plurality of magnetic field sensor elements are separated from the fourth plurality of magnetic field sensor elements by a second sensor pitch that is equal to the first sensor pitch, wherein the third plurality of magnetic field sensor elements and the fourth plurality of magnetic field sensor elements are sensitive to a second in-plane component of the magnetic field and are configured to generate a second differential sensor signal based on the second in-plane component of the magnetic field, wherein the first differential sensor signal and the second differential sensor signal are equal, and wherein the first differential sensor signal and the second differential sensor signal are representative of a position of the magnet relative to the magnetic field sensor chip.

Aspect 19: The position sensor arrangement of Aspect 18, wherein the linear path is parallel to the first axis.

Aspect 20: The position sensor arrangement of any of Aspects 18-19, wherein the linear path is perpendicular to the first axis and the second axis.

Aspect 21: The position sensor arrangement of any of Aspects 18-20, wherein the magnet is an axially magnetized magnet.

Aspect 22: A current sensor arrangement, comprising: a conductor configured to carry a current which produces a magnetic field; and a magnetic field sensor chip, comprising: a chip surface defined by a first dimension that extends along a first axis and a second dimension that extends along a second axis perpendicular to the first axis; a center of symmetry located on the chip surface, wherein the first axis and the second axis the center of symmetry intersect the center of symmetry; a first sensor bridge circuit comprising a first plurality of magnetic field sensor elements and a second plurality of magnetic field sensor elements, wherein the first plurality of magnetic field sensor elements are positioned symmetrical to the second plurality of magnetic field sensor elements across the center of symmetry, wherein the first plurality of magnetic field sensor elements are separated from the second plurality of magnetic field sensor elements by a first sensor pitch, wherein the first plurality of magnetic field sensor elements and the second plurality of magnetic field sensor elements are sensitive to a first in-plane component of the magnetic field and are configured to generate a first differential sensor signal based on the first in-plane component of the magnetic field; and a second sensor bridge circuit comprising a third plurality of magnetic field sensor elements and a fourth plurality of magnetic field sensor elements, wherein the third plurality of magnetic field sensor elements are positioned symmetrical to the fourth plurality of magnetic field sensor elements across the center of symmetry, wherein the third plurality of magnetic field sensor elements are separated from the fourth plurality of magnetic field sensor elements by a second sensor pitch that is equal to the first sensor pitch, wherein the third plurality of magnetic field sensor elements and the fourth plurality of magnetic field sensor elements are sensitive to a second in-plane component of the magnetic field and are configured to generate a second differential sensor signal based on the second in-plane component of the magnetic field, wherein the first differential sensor signal and the second differential sensor signal are equal, and wherein the first differential sensor signal and the second differential sensor signal are representative of a measurement of the current.

Aspect 23: The current sensor arrangement of Aspect 22, wherein the conductor is configured to carry the current along a current path that is parallel to the second axis, wherein the conductor comprises a conductor edge that extends parallel to the second axis and overlaps with the center of symmetry in an out-of-plane direction that is perpendicular to the first axis and the second axis, wherein the first plurality of magnetic field sensor elements and the third plurality of magnetic field sensor elements are displaced from the second axis such that the first plurality of magnetic field sensor elements and the third plurality of magnetic field sensor elements overlap with the conductor in the out-of-plane direction, and wherein the second plurality of magnetic field sensor elements and the fourth plurality of magnetic field sensor elements are displaced from the second axis such that the second plurality of magnetic field sensor elements and the fourth plurality of magnetic field sensor elements do not overlap with the conductor in the out-of-plane direction.

Aspect 24: The current sensor arrangement of any of Aspects 22-23, wherein the conductor is a U-shaped conductor comprising a first conductor segment that is configured to carry the current in a first current direction that is parallel to the second axis and a second conductor segment that is configured to carry the current in a second current direction that is antiparallel to the first current direction, wherein the first plurality of magnetic field sensor elements and the third plurality of magnetic field sensor elements are displaced from the second axis such that the first plurality of magnetic field sensor elements and the third plurality of magnetic field sensor elements overlap with the first conductor segment in an out-of-plane direction that is perpendicular to the first axis and the second axis, and wherein the second plurality of magnetic field sensor elements and the fourth plurality of magnetic field sensor elements are displaced from the second axis such that the second plurality of magnetic field sensor elements and the fourth plurality of magnetic field sensor elements overlap with the second conductor segment in the out-of-plane direction.

Aspect 25: A system configured to perform one or more operations recited in one or more of Aspects 1-24.

Aspect 26: An apparatus comprising means for performing one or more operations recited in one or more of Aspects 1-24.

Aspect 27: A non-transitory computer-readable medium storing a set of instructions, the set of instructions comprising one or more instructions that, when executed by a device, cause the device to perform one or more operations recited in one or more of Aspects 1-24.

Aspect 28: A computer program product comprising instructions or code for executing one or more operations recited in one or more of Aspects 1-24.

The foregoing disclosure provides illustration and description, but is not intended to be exhaustive or to limit the implementations to the precise form disclosed. Modifications and variations are possible in light of the above disclosure or may be acquired from practice of the implementations.

As used herein, the term component is intended to be broadly construed as hardware, firmware, or a combination of hardware and software.

It will be apparent that systems and/or methods, described herein, may be implemented in different forms of hardware, firmware, or a combination of hardware and software. The actual specialized control hardware or software code used to implement these systems and/or methods is not limiting of the implementations. Thus, the operation and behavior of the systems and/or methods were described herein without reference to specific software code—it being understood that software and hardware can be designed to implement the systems and/or methods based on the description herein.

Any of the processing components may be implemented as a central processing unit (CPU) or other processor reading and executing a software program from a non-transitory computer-readable recording medium such as a hard disk or a semiconductor memory device. For example, instructions may be executed by one or more processors, such as one or more CPUs, digital signal processors (DSPs), general-purpose microprocessors, application-specific integrated circuits (ASICs), field programmable logic arrays (FPLAs), programmable logic controller (PLC), or other equivalent integrated or discrete logic circuitry. Accordingly, the term "processor," as used herein refers to any of the foregoing structures or any other structure suitable for implementation of the techniques described herein.

A controller including hardware may also perform one or more of the techniques of this disclosure. A controller, including one or more processors, may use electrical signals and digital algorithms to perform its receptive, analytic, and control functions, which may further include corrective functions. Such hardware, software, and firmware may be implemented within the same device or within separate devices to support the various techniques described in this disclosure.

A signal processing circuit and/or a signal conditioning circuit may receive one or more signals (e.g., measurement signals) from one or more components in the form of raw measurement data and may derive, from the measurement signal further information. Signal conditioning, as used herein, refers to manipulating an analog signal in such a way that the signal meets the requirements of a next stage for further processing. Signal conditioning may include converting from analog to digital (e.g., via an analog-to-digital converter), amplification, filtering, converting, biasing, range matching, isolation and any other processes required to make a signal suitable for processing after conditioning.

Even though particular combinations of features are recited in the claims and/or disclosed in the specification, these combinations are not intended to limit the disclosure of implementations described herein. Many of these features may be combined in ways not specifically recited in the claims and/or disclosed in the specification. For example, the disclosure includes each dependent claim in a claim set in combination with every other individual claim in that claim set and every combination of multiple claims in that claim set. As used herein, a phrase referring to "at least one of" a list of items refers to any combination of those items, including single members. As an example, "at least one of: a, b, or c" is intended to cover a, b, c, a+b, a+c, b+c, and a+b+c, as well as any combination with multiples of the same element (e.g., a+a, a+a+a, a+a+b, a+a+c, a+b+b, a+c+c, b+b, b+b+b, b+b+c, c+c, and c+c+c, or any other ordering of a, b, and c).

Further, it is to be understood that the disclosure of multiple acts or functions disclosed in the specification or in the claims may not be construed as to be within the specific order. Therefore, the disclosure of multiple acts or functions will not limit these to a particular order unless such acts or functions are not interchangeable for technical reasons. Furthermore, in some implementations, a single act may include or may be broken into multiple sub acts. Such sub acts may be included and part of the disclosure of this single act unless explicitly excluded.

No element, act, or instruction used herein should be construed as critical or essential unless explicitly described as such. Also, as used herein, the articles "a" and "an" are intended to include one or more items and may be used interchangeably with "one or more." Further, as used herein, the article "the" is intended to include one or more items referenced in connection with the article "the" and may be used interchangeably with "the one or more." Where only one item is intended, the phrase "only one," "single," or similar language is used. Also, as used herein, the terms "has," "have," "having," or the like are intended to be open-ended terms that do not limit an element that they modify (e.g., an element "having" A may also have B). Further, the phrase "based on" is intended to mean "based, at least in part, on" unless explicitly stated otherwise. As used herein, the term "multiple" can be replaced with "a plurality of" and vice versa. Also, as used herein, the term "or" is intended to be inclusive when used in a series and may be used interchangeably with "and/or," unless explicitly stated otherwise (e.g., if used in combination with "either" or "only one of").

What is claimed is:

1. A magnetic field sensor chip, comprising:
    a chip surface defined by a first dimension that extends along a first axis and a second dimension that extends along a second axis perpendicular to the first axis;
    a center of symmetry located on the chip surface, wherein the first axis and the second axis intersect the center of symmetry;
    a first sensor bridge circuit comprising a first plurality of magnetic field sensor elements and a second plurality of magnetic field sensor elements, wherein the first plurality of magnetic field sensor elements are positioned symmetrical to the second plurality of magnetic field sensor elements across the center of symmetry, wherein the first plurality of magnetic field sensor elements are separated from the second plurality of magnetic field sensor elements by a first sensor pitch, and wherein the first plurality of magnetic field sensor elements and the second plurality of magnetic field sensor elements are sensitive to a first in-plane component of a magnetic field and are configured to generate a first differential sensor signal based on the first in-plane component of the magnetic field; and
    a second sensor bridge circuit comprising a third plurality of magnetic field sensor elements and a fourth plurality of magnetic field sensor elements, wherein the third plurality of magnetic field sensor elements are positioned symmetrical to the fourth plurality of magnetic field sensor elements across the center of symmetry, wherein the third plurality of magnetic field sensor elements are separated from the fourth plurality of magnetic field sensor elements by a second sensor pitch that is equal to the first sensor pitch, and wherein the third plurality of magnetic field sensor elements and the fourth plurality of magnetic field sensor elements are sensitive to a second in-plane component of the magnetic field and are configured to generate a second differential sensor signal based on the second in-plane component of the magnetic field,
    wherein the first differential sensor signal and the second differential sensor signal are equal.

2. The magnetic field sensor chip of claim 1, wherein the first plurality of magnetic field sensor elements, the second plurality of magnetic field sensor elements, the third plurality of magnetic field sensor elements, and the fourth plurality of magnetic field sensor elements are magnetoresistive sensor elements or vertical Hall sensor elements.

3. The magnetic field sensor chip of claim 1, wherein the first plurality of magnetic field sensor elements and the second plurality of magnetic field sensor elements are electrically coupled to form a first full-bridge configured to generate the first differential sensor signal, and
    wherein the third plurality of magnetic field sensor elements and the fourth plurality of magnetic field sensor elements are electrically coupled to form a second full-bridge configured to generate the second differential sensor signal.

4. The magnetic field sensor chip of claim 1, wherein the first plurality of magnetic field sensor elements are electrically coupled to form a first full-bridge, the second plurality of magnetic field sensor elements are electrically coupled to form a second full-bridge, the third plurality of magnetic field sensor elements are electrically coupled to form a third full-bridge, and the fourth plurality of magnetic field sensor elements are electrically coupled to form a fourth full-bridge.

5. The magnetic field sensor chip of claim 1, wherein each magnetic field sensor element of the first plurality of magnetic field sensor elements and the second plurality of magnetic field sensor elements is positioned on a third axis that intersects the center of symmetry and that is rotated from the first axis by a positive angle, wherein the positive angle is greater than 0° and less than 90°, and wherein each magnetic field sensor element of the third plurality of magnetic field sensor elements and the fourth plurality of magnetic field sensor elements is positioned on a fourth axis that intersects the center of symmetry and that is rotated from the first axis by a negative angle that is equal in magnitude to the positive angle.

6. The magnetic field sensor chip of claim 5, wherein each magnetic field sensor element of the first plurality of magnetic field sensor elements and the second plurality of magnetic field sensor elements has a first respective sensitivity axis that is coincident with the third axis, and wherein each magnetic field sensor element of the third plurality of magnetic field sensor elements and the fourth plurality of magnetic field sensor elements has a second respective sensitivity axis that is coincident with the fourth axis.

7. The magnetic field sensor chip of claim 5, wherein the first plurality of magnetic field sensor elements includes a first magnetic field sensor element and a second magnetic field sensor element, wherein the second plurality of magnetic field sensor elements includes a third magnetic field sensor element and a fourth magnetic field sensor element, wherein the third plurality of magnetic field sensor elements includes a fifth magnetic field sensor element and a sixth magnetic field sensor element, wherein the fourth plurality of magnetic field sensor elements includes a seventh magnetic field sensor element and an eighth magnetic field sensor element, wherein the first magnetic field sensor element, the third magnetic field sensor element, fifth magnetic field sensor element, and seventh magnetic field sensor element are positioned at a first radial distance from the center of symmetry, and wherein the second magnetic field sensor element, the fourth magnetic field sensor element, sixth magnetic field sensor element, and eighth magnetic field sensor element are positioned at a second radial distance from the center of symmetry that is greater than the first radial distance.

8. The magnetic field sensor chip of claim 5, wherein the positive angle is greater than 10° and less than 80°.

9. The magnetic field sensor chip of claim 1, wherein the first plurality of magnetic field sensor elements, the second plurality of magnetic field sensor elements, the third plurality of magnetic field sensor elements, and the fourth plurality of magnetic field sensor elements are positioned on the chip surface to sense substantially a same magnitude of magnetic field flux density of the magnetic field.

10. The magnetic field sensor chip of claim 1, further comprising:

a third axis that intersects the center of symmetry and that is rotated from the first axis by a positive angle, wherein the positive angle is greater than 0° and less than 90°; and a fourth axis that intersects the center of symmetry and that is rotated from the first axis by a negative angle that is equal in magnitude to the positive angle, wherein each magnetic field sensor element of the first plurality of magnetic field sensor elements and the second plurality of magnetic field sensor elements has a first respective sensitivity axis that is parallel to the third axis, and wherein each magnetic field sensor element of the third plurality of magnetic field sensor elements and the fourth plurality of magnetic field sensor elements has a second respective sensitivity axis that is parallel to the fourth axis.

11. The magnetic field sensor chip of claim 10, wherein the first plurality of magnetic field sensor elements are electrically coupled to form a first full-bridge, the second plurality of magnetic field sensor elements are electrically coupled to form a second full-bridge, the third plurality of magnetic field sensor elements are electrically coupled to form a third full-bridge, and the fourth plurality of magnetic field sensor elements are electrically coupled to form a fourth full-bridge, wherein the first full-bridge, the second full-bridge, the third full-bridge, the fourth full-bridge have a same radial distance from the center of symmetry.

12. The magnetic field sensor chip of claim 10, wherein the positive angle is greater than 10° and less than 80°.

13. The magnetic field sensor chip of claim 10, wherein the third axis and the fourth axis are in a chip plane defined by the first axis and the second axis.

14. The magnetic field sensor chip of claim 1, wherein each magnetic field sensor element of the first plurality of magnetic field sensor elements and the third plurality of magnetic field sensor elements is positioned on a third axis that is parallel to the first axis and that is offset from the center of symmetry along the second axis by a positive offset distance, wherein each magnetic field sensor element of the second plurality of magnetic field sensor elements and the fourth plurality of magnetic field sensor elements is positioned on a fourth axis that is parallel to the first axis and that is offset from the center of symmetry along the second axis by a negative offset distance that is equal in magnitude to the positive offset distance.

15. The magnetic field sensor chip of claim 14, wherein each magnetic field sensor element of the first plurality of magnetic field sensor elements and the third plurality of magnetic field sensor elements has a first respective sensitivity axis that is coincident with the third axis, and wherein each magnetic field sensor element of the second plurality of magnetic field sensor elements and the fourth plurality of magnetic field sensor elements has a second respective sensitivity axis that is coincident with the fourth axis.

16. The magnetic field sensor chip of claim 1, further comprising:

a third axis that is parallel to the first axis and that is offset from the center of symmetry along the second axis by a positive offset distance; and a fourth axis that is parallel to the first axis and that is offset from the center of symmetry along the second axis by a negative offset distance that is equal in magnitude to the positive offset distance, wherein the first plurality of magnetic field sensor elements are arranged symmetrically about the third axis, wherein the third plurality of magnetic field sensor elements are arranged symmetrically about the third axis, wherein the second plurality of magnetic field sensor elements are arranged symmetrically about the fourth axis, and wherein the fourth plurality of magnetic field sensor elements are arranged symmetrically about the fourth axis.

17. The magnetic field sensor chip of claim 16, wherein each magnetic field sensor element of the first plurality of magnetic field sensor elements, the second plurality of magnetic field sensor elements, the third plurality of magnetic field sensor elements, and the fourth plurality of magnetic field sensor elements have a same direction of sensitivity.

18. A position sensor arrangement, comprising:
    a magnet configured to produce a magnetic field and further configured to move along a linear path; and
    a magnetic field sensor chip, comprising:
        a chip surface defined by a first dimension that extends along a first axis and a second dimension that extends along a second axis perpendicular to the first axis;
        a center of symmetry located on the chip surface, wherein the first axis and the second axis intersect the center of symmetry;
        a first sensor bridge circuit comprising a first plurality of magnetic field sensor elements and a second plurality of magnetic field sensor elements, wherein the first plurality of magnetic field sensor elements are positioned symmetrical to the second plurality of magnetic field sensor elements across the center of symmetry, wherein the first plurality of magnetic field sensor elements are separated from the second plurality of magnetic field sensor elements by a first sensor pitch, and wherein the first plurality of magnetic field sensor elements and the second plurality of magnetic field sensor elements are sensitive to a first in-plane component of the magnetic field and are configured to generate a first differential sensor signal based on the first in-plane component of the magnetic field; and
        a second sensor bridge circuit comprising a third plurality of magnetic field sensor elements and a fourth plurality of magnetic field sensor elements, wherein the third plurality of magnetic field sensor elements are positioned symmetrical to the fourth plurality of magnetic field sensor elements across the center of symmetry, wherein the third plurality of magnetic field sensor elements are separated from the fourth plurality of magnetic field sensor elements by a second sensor pitch that is equal to the first sensor pitch, and wherein the third plurality of magnetic field sensor elements and the fourth plurality of magnetic field sensor elements are sensitive to a second in-plane component of the magnetic field and are configured to generate a second differential sensor signal based on the second in-plane component of the magnetic field,
        wherein the first differential sensor signal and the second differential sensor signal are equal, and
        wherein the first differential sensor signal and the second differential sensor signal are representative of a position of the magnet relative to the magnetic field sensor chip.

19. The position sensor arrangement of claim 18, wherein the linear path is parallel to the first axis.

20. The position sensor arrangement of claim 18, wherein the linear path is perpendicular to the first axis and the second axis.

21. The position sensor arrangement of claim 18, wherein the magnet is an axially magnetized magnet.

22. A current sensor arrangement, comprising:
    a conductor configured to carry a current which produces a magnetic field; and
    a magnetic field sensor chip, comprising:
        a chip surface defined by a first dimension that extends along a first axis and a second dimension that extends along a second axis perpendicular to the first axis;
        a center of symmetry located on the chip surface, wherein the first axis and the second axis the center of symmetry intersect the center of symmetry;
        a first sensor bridge circuit comprising a first plurality of magnetic field sensor elements and a second plurality of magnetic field sensor elements, wherein the first plurality of magnetic field sensor elements are positioned symmetrical to the second plurality of magnetic field sensor elements across the center of symmetry, wherein the first plurality of magnetic field sensor elements are separated from the second plurality of magnetic field sensor elements by a first sensor pitch, and wherein the first plurality of magnetic field sensor elements and the second plurality of magnetic field sensor elements are sensitive to a first in-plane component of the magnetic field and are configured to generate a first differential sensor signal based on the first in-plane component of the magnetic field; and
        a second sensor bridge circuit comprising a third plurality of magnetic field sensor elements and a fourth plurality of magnetic field sensor elements, wherein the third plurality of magnetic field sensor elements are positioned symmetrical to the fourth plurality of magnetic field sensor elements across the center of symmetry, wherein the third plurality of magnetic field sensor elements are separated from the fourth plurality of magnetic field sensor elements by a second sensor pitch that is equal to the first sensor pitch, and wherein the third plurality of magnetic field sensor elements and the fourth plurality of magnetic field sensor elements are sensitive to a second in-plane component of the magnetic field and are configured to generate a second differential sensor signal based on the second in-plane component of the magnetic field,
        wherein the first differential sensor signal and the second differential sensor signal are equal, and
        wherein the first differential sensor signal and the second differential sensor signal are representative of a measurement of the current.

23. The current sensor arrangement of claim 22, wherein the conductor is configured to carry the current along a current path that is parallel to the second axis,
    wherein the conductor comprises a conductor edge that extends parallel to the second axis and overlaps with the center of symmetry in an out-of-plane direction that is perpendicular to the first axis and the second axis,
    wherein the first plurality of magnetic field sensor elements and the third plurality of magnetic field sensor elements are displaced from the second axis such that the first plurality of magnetic field sensor elements and the third plurality of magnetic field sensor elements overlap with the conductor in the out-of-plane direction, and
    wherein the second plurality of magnetic field sensor elements and the fourth plurality of magnetic field sensor elements are displaced from the second axis such that the second plurality of magnetic field sensor elements and the fourth plurality of magnetic field sensor elements do not overlap with the conductor in the out-of-plane direction.

24. The current sensor arrangement of claim 22, wherein the conductor is a U-shaped conductor comprising a first conductor segment that is configured to carry the current in a first current direction that is parallel to the second axis and a second conductor segment that is configured to carry the current in a second current direction that is antiparallel to the first current direction,
- wherein the first plurality of magnetic field sensor elements and the third plurality of magnetic field sensor elements are displaced from the second axis such that the first plurality of magnetic field sensor elements and the third plurality of magnetic field sensor elements overlap with the first conductor segment in an out-of-plane direction that is perpendicular to the first axis and the second axis, and
- wherein the second plurality of magnetic field sensor elements and the fourth plurality of magnetic field sensor elements are displaced from the second axis such that the second plurality of magnetic field sensor elements and the fourth plurality of magnetic field sensor elements overlap with the second conductor segment in the out-of-plane direction.

* * * * *